US009299942B2

(12) United States Patent
Seo et al.

(10) Patent No.: US 9,299,942 B2
(45) Date of Patent: Mar. 29, 2016

(54) LIGHT-EMITTING ELEMENT, LIGHT-EMITTING DEVICE, DISPLAY DEVICE, ELECTRONIC APPLIANCE, AND LIGHTING DEVICE

(71) Applicant: Semiconductor Energy Laboratory Co., Ltd., Kanagawa-ken (JP)

(72) Inventors: Hiromi Seo, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/804,508

(22) Filed: Mar. 14, 2013

(65) Prior Publication Data

US 2013/0256637 A1    Oct. 3, 2013

(30) Foreign Application Priority Data

Mar. 30, 2012    (JP) .................. 2012-081141

(51) Int. Cl.
*H01L 51/50*    (2006.01)
(52) U.S. Cl.
CPC ........ *H01L 51/5004* (2013.01); *H01L 51/5016* (2013.01); *H01L 2251/5384* (2013.01)
(58) Field of Classification Search
CPC ............ H01L 51/0085; H01L 51/5016; H01L 51/0081; H01L 51/0072; H01L 51/5036; H01L 2251/552; H01L 2251/5384; H01L 51/5004
USPC ................... 257/40, 103, E51.018, E51.026, 257/E51.024; 438/29
See application file for complete search history.

(56) References Cited

U.S. PATENT DOCUMENTS

| 7,875,879 | B2 | 1/2011 | Suzuki et al. | |
| 8,278,649 | B2 | 10/2012 | Ohsawa | |
| 2004/0183082 | A1* | 9/2004 | Yamazaki | 257/79 |
| 2006/0066231 | A1* | 3/2006 | Nishikawa et al. | 313/506 |
| 2007/0003786 | A1* | 1/2007 | Royster | 428/690 |
| 2008/0149923 | A1 | 6/2008 | Ohsawa et al. | |
| 2008/0217608 | A1* | 9/2008 | Suzuki et al. | 257/40 |
| 2008/0268561 | A1 | 10/2008 | Ikeda et al. | |
| 2008/0284318 | A1* | 11/2008 | Deaton et al. | 313/504 |

(Continued)

FOREIGN PATENT DOCUMENTS

JP    2007-96023    4/2007

OTHER PUBLICATIONS

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

(Continued)

*Primary Examiner* — Marvin Payen
*Assistant Examiner* — Victor Barzykin
(74) *Attorney, Agent, or Firm* — Husch Blackwell LLP

(57) ABSTRACT

Provided is a light-emitting element with a small degree of luminance degradation with accumulation of driving time (a long-lifetime light-emitting element). Provided is a light-emitting element in which a light-emitting layer with an electron-transport property is formed with a plurality of layers containing different host materials. Further, the LUMO level of a host material on an anode side is higher than the LUMO level of a host material on a cathode side. With such a structure, it is possible to provide a long-lifetime light-emitting element with little degradation in luminance with accumulation of driving time.

11 Claims, 19 Drawing Sheets

(56) References Cited

U.S. PATENT DOCUMENTS

| | | |
|---|---|---|
| 2010/0148166 A1 | 6/2010 | Ushikubo et al. |
| 2010/0301382 A1* | 12/2010 | Shitagaki et al. ............. 257/103 |
| 2011/0108810 A1* | 5/2011 | Kishino ......................... 257/40 |
| 2011/0210316 A1* | 9/2011 | Kadoma et al. ................ 257/40 |
| 2012/0119197 A1* | 5/2012 | Nishimura et al. ............ 257/40 |
| 2012/0237669 A1 | 9/2012 | Seo et al. |

OTHER PUBLICATIONS

Onishi, T. et al, "A Method of Measuring an Energy Level," *High Molecular EL Materials Development of Light-Emitting High Molecular Compounds*, Kyoritsu Shuppan, Dec. 25, 2004, p. 64-67 (with English translation, pp. 1-3).

* cited by examiner

2mDBTBPDBq-II

2mDBTBPDBQu-II

FIG. 8A
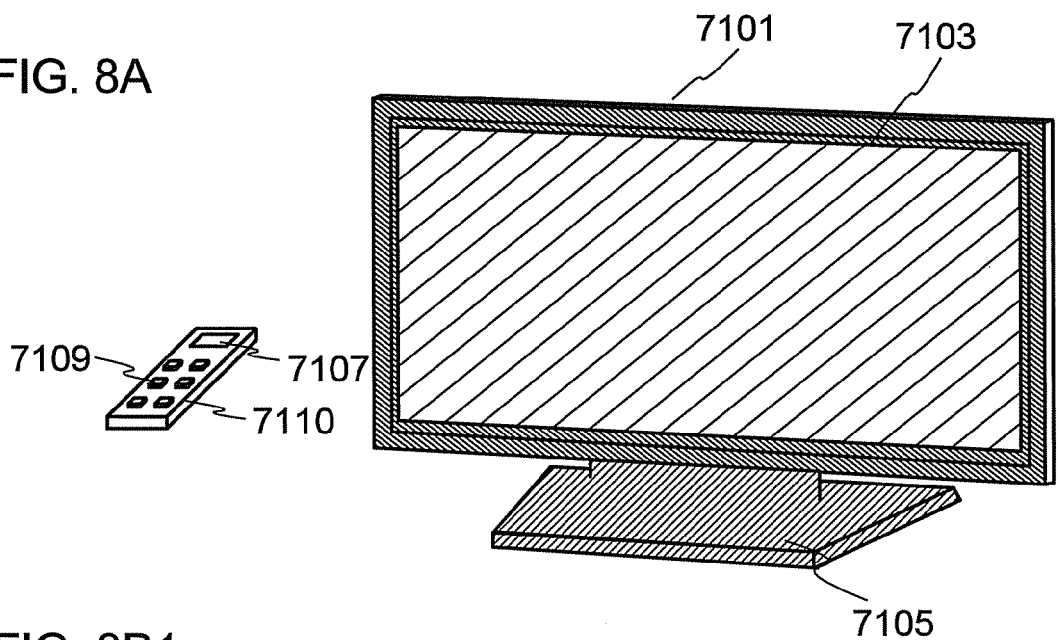
FIG. 8B1
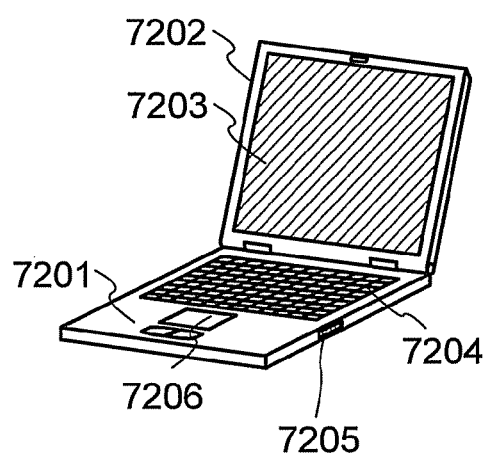
FIG. 8B2
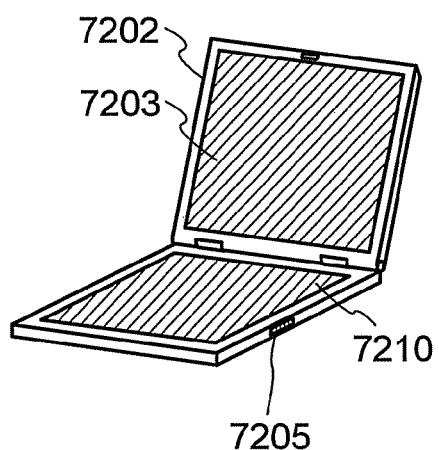
FIG. 8C
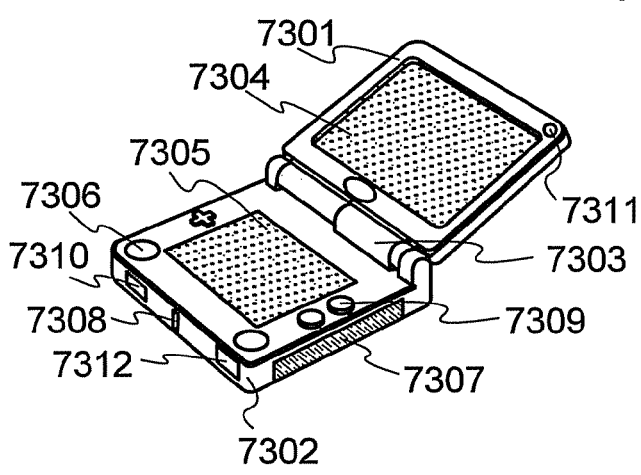
FIG. 8D
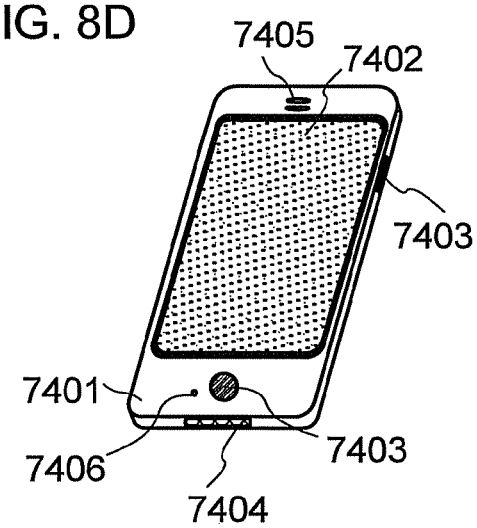

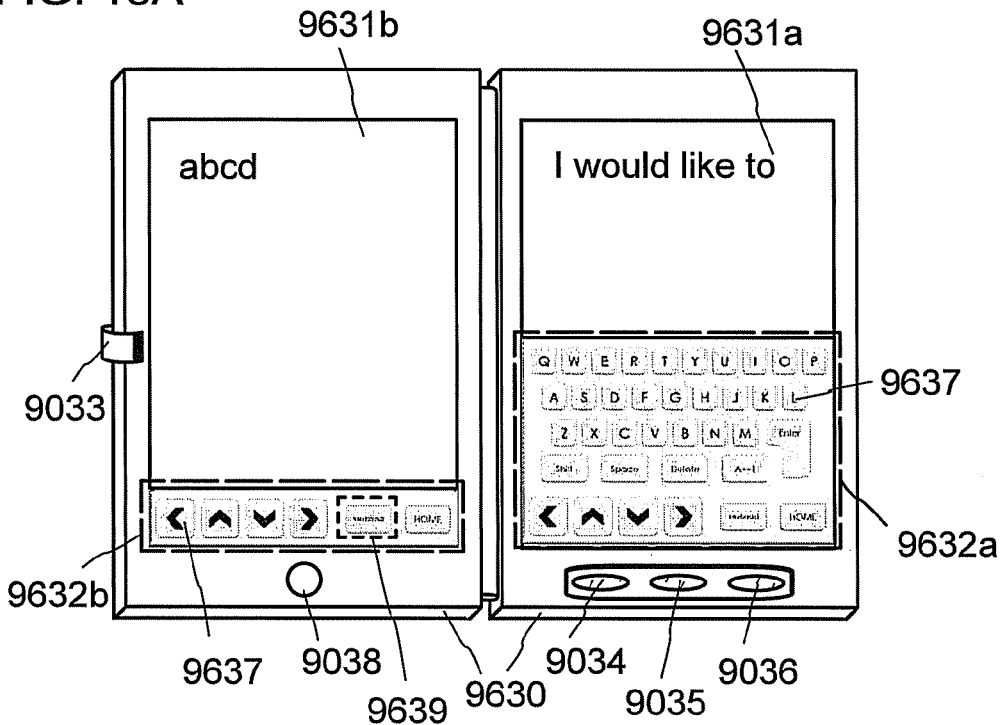
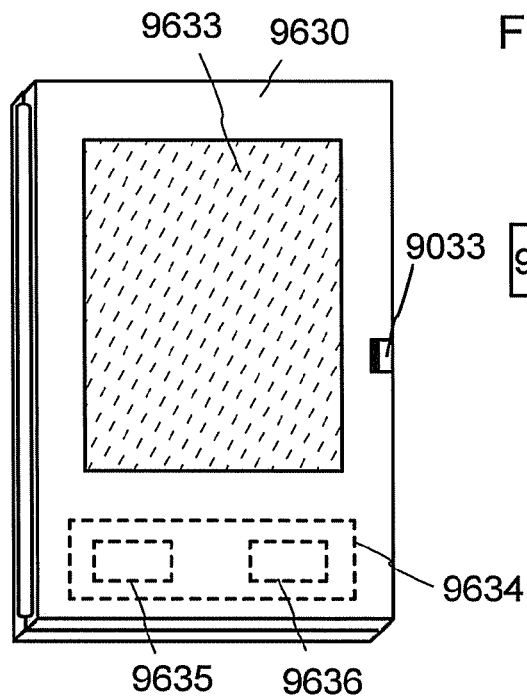
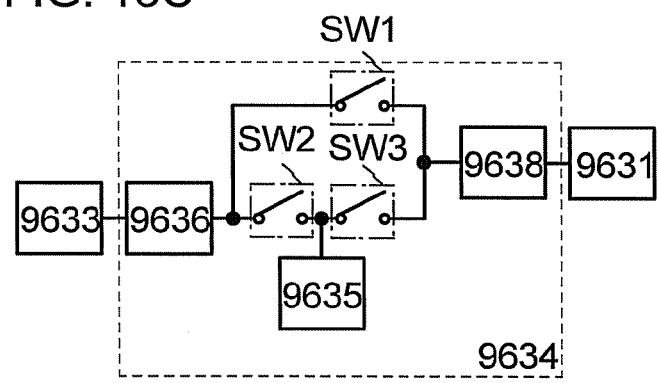

LIGHT-EMITTING ELEMENT, LIGHT-EMITTING DEVICE, DISPLAY DEVICE, ELECTRONIC APPLIANCE, AND LIGHTING DEVICE

BACKGROUND OF THE INVENTION

1. Field of the Invention

The present invention relates to a light-emitting element, a light-emitting device, a display device, an electronic appliance, and a lighting device in each of which an organic compound is used as a light-emitting substance.

2. Description of the Related Art

In recent years, research and development have been extensively conducted on light-emitting elements using electroluminescence (EL). In a basic structure of such a light-emitting element, a layer containing a light-emitting substance is interposed between a pair of electrodes. By applying voltage to this element, light emission from the light-emitting substance can be obtained. In particular, a light-emitting element in which the light-emitting substance is an organic compound is referred to as an organic light-emitting diode (OLED) or organic EL and has the following features.

The above light-emitting element is a self-luminous element and thus has higher pixel visibility than a liquid crystal display and does not need a backlight. Therefore, the light-emitting element is suitable for a flat panel display element. Further, using the light-emitting element, a thinner and lighter display can be manufactured.

In addition, the light-emitting element has an extremely high response speed; accordingly, a high-quality moving image can be provided.

Further, the light-emitting element can be formed in a film form, enabling planar light emission. This is a feature which is difficult to obtain from point light sources typified by an incandescent lamp and an LED lamp or linear light sources typified by a fluorescent lamp. Accordingly, the light-emitting element has a great deal of potential for use as planar light sources which can be used for lighting and the like.

One of important properties of such a light-emitting element is the degree of luminance degradation over driving time, i.e., the lifetime. With the accumulation of the driving time, the luminance of the light-emitting element is reduced even when the light-emitting element is made to emit light at the same current density. Japan Luminaires Association has determined that the lifetime of a lighting device having such a property is the time when the luminance becomes 70% of its initial luminance; it is said that the lifetime of a commercially available LED lamp is 40000 hours to 50000 hours. An OLED lighting, which is a latecomer, needs to secure at least the same lifetime or longer. Needless to say, also in an OLED display, it is preferable that the degradation in luminance be as little as possible.

Patent Document 1 discloses a light-emitting element in which a recombination region is formed at the interface between a first light-emitting layer and a second light-emitting layer.

REFERENCE

Patent Document

[Patent Document 1] Japanese Published Patent Application No. 2007-96023

SUMMARY OF THE INVENTION

Here, the lifetime will be discussed. The lifetime is determined by at least two broadly classified factors: a material itself and an element structure. The property of the material itself will not be improved unless the material is changed; however, when the lifetime can be made longer by a change of the element structure or the compatibility of materials, application to a variety of materials can be achieved and the application range is relatively wide.

Thus, an object of one embodiment of the present invention is to provide a light-emitting element with a small degree of luminance degradation with accumulation of driving time (a long-lifetime light-emitting element). An object of one embodiment of the present invention is to provide a light-emitting device, a display device, an electronic appliance, and a lighting device each with high reliability by using the above light-emitting element.

It is only necessary that at least one of the above-described objects be achieved in the present invention.

One embodiment of the present invention provides a light-emitting element in which a light-emitting layer with an electron-transport property is formed with a plurality of layers containing different host materials. Further, the LUMO level of a host material on an anode side is higher than the LUMO level of a host material on a cathode side. With such a structure, it is possible to provide a long-lifetime light-emitting element with little degradation in luminance with accumulation of driving time.

That is, one embodiment of the present invention is a light-emitting element including an anode, a cathode, and an EL layer between the anode and the cathode. The EL layer includes at least a light-emitting layer. In addition, the light-emitting layer includes a first light-emitting layer on an anode side and a second light-emitting layer on a cathode side. Further, the first light-emitting layer contains a first host material and a first emission center substance, and the second light-emitting layer contains a second host material and a second emission center substance. Furthermore, the first light-emitting layer and the second light-emitting layer each have an electron-transport property, and the LUMO level of the first host material is higher than the LUMO level of the second host material.

Another embodiment of the present invention is a light-emitting element including an anode, a cathode, and an EL layer between the anode and the cathode. The EL layer includes at least a light-emitting layer. In addition, the light-emitting layer includes a first light-emitting layer on an anode side and a second light-emitting layer on a cathode side. Further, the first light-emitting layer contains a first host material and a first emission center substance, and the second light-emitting layer contains a second host material and a second emission center substance. Furthermore, the first light-emitting layer and the second light-emitting layer each have an electron-transport property, the first host material and the second host material each have a molecular weight of greater than or equal to 300 and less than or equal to 2000 and a six-membered aromatic ring in an electron-transport skeleton, and nitrogen atoms included in the six-membered aromatic ring in the first host material are fewer than nitrogen atoms included in the six-membered aromatic ring in the second host material.

Another embodiment of the present invention is a light-emitting element including an anode, a cathode, and an EL layer between the anode and the cathode. The EL layer includes at least a light-emitting layer. In addition, the light-emitting layer includes a first light-emitting layer on an anode side and a second light-emitting layer on a cathode side. Further, the first light-emitting layer contains a first host material and a first emission center substance, and the second light-emitting layer contains a second host material and a second emission center substance. Furthermore, the first light-emitting layer and the second light-emitting layer each have an electron-transport property, the first host material and the second host material each have a molecular weight of greater than or equal to 300 and less than or equal to 2000 and a six-membered aromatic ring in a skeleton over which LUMO is dispersed, and nitrogen atoms included in the six-membered aromatic ring in the first host material are fewer than nitrogen atoms included in the six-membered aromatic ring in the second host material.

Another embodiment of the present invention is a light-emitting element having any of the above structures in which the six-membered aromatic ring of the first host material has a benzene skeleton or a pyridine skeleton, and the six-membered aromatic ring of the second host material has a diazine skeleton.

Another embodiment of the present invention is a light-emitting element including an anode, a cathode, and an EL layer between the anode and the cathode. The EL layer includes at least a light-emitting layer. In addition, the light-emitting layer includes a first light-emitting layer on an anode side and a second light-emitting layer on a cathode side. Further, the first light-emitting layer contains a first host material and a first emission center substance, and the second light-emitting layer contains a second host material and a second emission center substance. Furthermore, the first light-emitting layer and the second light-emitting layer each have an electron-transport property, the first host material and the second host material each have a molecular weight of greater than or equal to 300 and less than or equal to 2000 and a six-membered aromatic ring having a nitrogen atom in an electron-transport skeleton, and nitrogen atoms included in the six-membered aromatic ring in the first host material are equal to nitrogen atoms included in the six-membered aromatic ring in the second host material in number. Furthermore, the six-membered aromatic ring in the first host material is monocyclic, and the six-membered aromatic ring in the second host material further has a condensed aromatic ring.

Another embodiment of the present invention is a light-emitting element including an anode, a cathode, and an EL layer between the anode and the cathode. The EL layer includes at least a light-emitting layer. In addition, the light-emitting layer includes a first light-emitting layer on an anode side and a second light-emitting layer on a cathode side. Further, the first light-emitting layer contains a first host material and a first emission center substance, and the second light-emitting layer contains a second host material and a second emission center substance. Furthermore, the first light-emitting layer and the second light-emitting layer each have an electron-transport property, the first host material and the second host material each have a molecular weight of greater than or equal to 300 and less than or equal to 2000 and a six-membered aromatic ring having a nitrogen atom in a skeleton over which LUMO is dispersed, and nitrogen atoms included in the six-membered aromatic ring in the first host material are equal to nitrogen atoms included in the six-membered aromatic ring in the second host material in number. Furthermore, the six-membered aromatic ring in the first host material is monocyclic, and the six-membered aromatic ring in the second host material further has a condensed aromatic ring.

Another embodiment of the present invention is a light-emitting element having any of the above structures in which the six-membered aromatic ring in the first host material is the same as the six-membered aromatic ring in the second host material.

Another embodiment of the present invention is a light-emitting element having any of the above structures in which the first host material and the second host material each have an electron-transport property.

Another embodiment of the present invention is a light-emitting element having any of the above structures in which the first host material and the second host material each have an electron mobility of higher than or equal to $10^{-6}$ cm$^2$/Vs.

Another embodiment of the present invention is a light-emitting element having any of the above structures in which the first emission center substance is the same substance as the second emission center substance.

Another embodiment of the present invention is a light-emitting element having any of the above structures in which the first emission center substance and the second emission center substance are each able to convert a triplet excited state into light emission.

Another embodiment of the present invention is a light-emitting element having any of the above structures in which the first emission center substance and the second emission center substance are each an iridium complex.

Another embodiment of the present invention is a light-emitting element having any of the above structures in which neither of the first host material and the second host material has an aromatic amine skeleton in a skeleton.

Another embodiment of the present invention is a light-emitting element having any of the above structures in which the difference between the LUMO level of the first host material and the LUMO level of the second host material is greater than or equal to 0.1 eV and less than or equal to 0.6 eV.

Other embodiments of the present invention are a light-emitting device, a display device, an electronic appliance, and a lighting device each including a light-emitting element having any of the above structures.

Note that the light-emitting device in this specification includes an image display device that uses a light-emitting element. Further, the category of the light-emitting device in this specification includes a module in which a light-emitting element is provided with a connector such as an anisotropic conductive film, TAB (tape automated bonding) tape, or a TCP (tape carrier package); a module in which the top of the TAB tape or the TCP is provided with a printed wiring board; and a module in which an IC (integrated circuit) is directly mounted on a light-emitting element by a COG (chip on glass) method. Furthermore, light-emitting devices that are used in lighting devices and the like shall also be included.

One embodiment of the present invention can provide a light-emitting element with a small degree of luminance degradation over driving time (a long-lifetime light-emitting element). By using the light-emitting element, one embodiment of the present invention can provide a light-emitting device, a display device, an electronic appliance, and a lighting device each with high reliability.

BRIEF DESCRIPTION OF THE DRAWINGS

In the accompanying drawings:

FIGS. 8A to 8D each illustrate an electronic appliance;

FIGS. 13A to 13C illustrate an electronic appliance;

DETAILED DESCRIPTION OF THE INVENTION

Hereinafter, embodiments of the present invention will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Embodiment 1

Figure 1A:
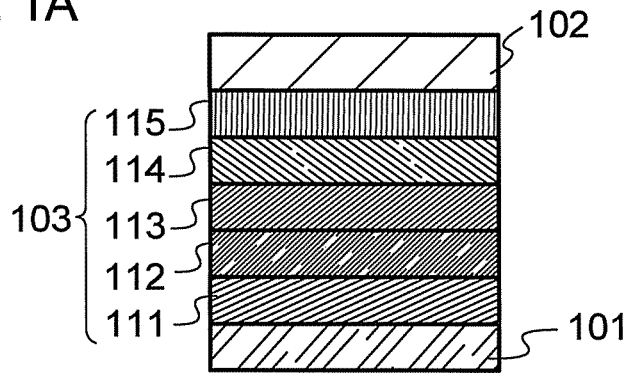
FIGS. 1A to 1C are conceptual diagrams of a light-emitting element.
Figure 1B:
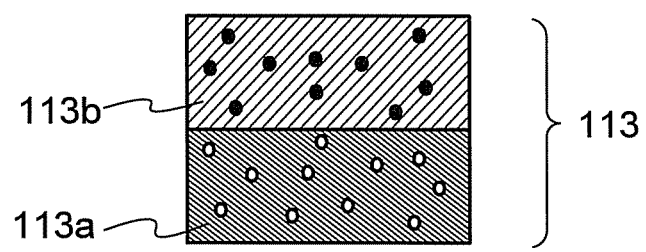
Figure 1C:
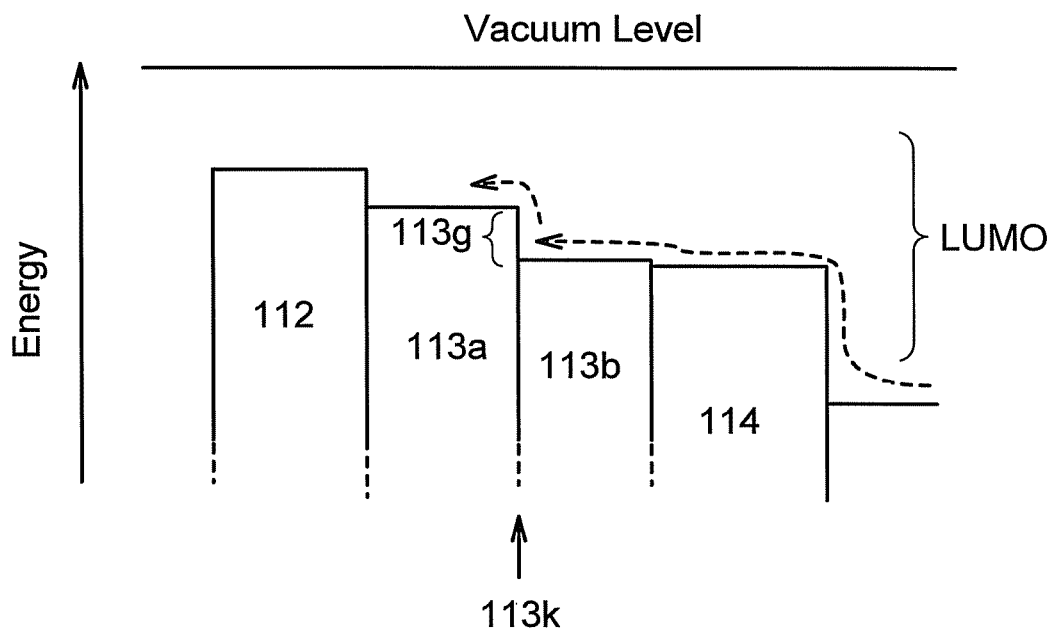

A structure of a light-emitting element in this embodiment is described using FIGS. 1A to 1C. In FIGS. 1A to 1C, a first electrode 101 serving as an anode, a second electrode 102 serving as a cathode, an EL layer 103, and a light-emitting layer 113 included in the EL layer 103 are illustrated. In FIGS. 1A to 1C, a hole-injection layer 111, a hole-transport layer 112, an electron-transport layer 114, and an electron-injection layer 115 are further illustrated; however, these layers are not always necessary and other layers may be further provided.

In a light-emitting element in which an organic compound is used as an emission center substance, light is obtained from the emission center substance excited by energy generated by recombination of holes injected to the EL layer 103 from the anode (the first electrode 101) and electrons injected to the EL layer 103 from the cathode (the second electrode 102). Therefore, such a light-emitting element has a high probability that a light-emitting region is formed around the recombination region.

For the light-emitting element in which the organic compound is used as the emission center substance, in order to prevent concentration quenching or T-T annihilation, a so-called host-guest type light-emitting layer in which the emission center substance is dispersed in a host material is commonly used. For the host material in such a light-emitting element, it is possible to use a substance with a hole-transport property or a substance with an electron-transport property. Here, a transport property of the light-emitting layer is determined by a compatibility of the host material and a guest material (emission center substance).

When the property of transporting one carrier is higher than the property of transporting the other carrier in the light-emitting layer, the recombination region may be localized on either the anode side or the cathode side of the light-emitting layer. When the recombination region or the light-emitting region concentrates on one portion in this manner, a heavy load may be put on the portion, so that degradation proceeds. Further, carriers may pass through the light-emitting layer to degrade the vicinity of the light-emitting layer (e.g., the hole-transport layer or the electron-transport layer).

In view of the above problems, according to this embodiment, in the light-emitting element including the light-emitting layer 113 with an electron-transport property, the light-emitting layer 113 is formed with two layers (a first light-emitting layer 113a and a second light-emitting layer 113b) as illustrated in FIG. 1B. Further, these light-emitting layers contain different host materials, and the host material in the first light-emitting layer 113a has a higher LUMO (lowest unoccupied molecular orbital) level than the host material in the second light-emitting layer 113b. Thus, it is possible to provide a long-lifetime light-emitting element with the above-described degradation suppressed.

In this structure, electrons need to climb over a barrier between the first light-emitting layer 113a and the second light-emitting layer 113b in order to enter the first light-emitting layer 113a. Accordingly, electrons move slowly and the recombination region, which has conventionally concentrated on one portion on the anode side of the light-emitting layer 113, can be dispersed within the light-emitting layer 113. As a result, a heavy load on the portion can be lightened and a degradation process can be suppressed. Further, this leads to suppression of the degradation in the vicinity of the light-emitting layer, i.e., degradation of the hole-transport layer in this case.

The above structure will be described in more detail. In a conventional light-emitting element including the light-emitting layer 113 with an electron-transport property, there is no LUMO step in the light-emitting layer 113. In such a light-emitting element, electrons injected to the light-emitting layer 113 are rapidly transported to the interface between the light-emitting layer 113 and the hole-transport layer 112. Therefore, holes are recombined with the electrons soon after being injected to the light-emitting layer 113, so that the recombination region concentrates on one portion on the anode side of the light-emitting layer 113.

In contrast, although the light-emitting layer 113 in the light-emitting element described in this embodiment also has an electron-transport property, as illustrated in FIG. 1C, the light-emitting layer 113 is formed with two layers (the first light-emitting layer 113a and the second light-emitting layer 113b) and includes a LUMO step 113g between the two layers. In the light-emitting element having such a structure, electrons injected to the second light-emitting layer 113b move as indicated by a dotted line in FIG. 1C and are rapidly transported to an interface 113k between the second light-emitting layer 113b and the first light-emitting layer 113a. However, because of the LUMO step 113g between the second light-emitting layer 113b and the first light-emitting layer 113a, electrons need to climb over the step (barrier) in order to enter the first light-emitting layer 113a; accordingly, electrons are gradually injected to the first light-emitting layer 113a. Meanwhile, holes injected to the first light-emitting layer 113a can move to an inner portion of the light-emitting layer, and the electron-and-hole recombination region can be dispersed. Thus, the heavy load on the portion due to the concentration of the light-emitting region can be lightened and degradation of the portion can be suppressed. As a result, the light-emitting element described in this embodiment can have a long lifetime.

(Host Materials)

In order that the first light-emitting layer 113a and the second light-emitting layer 113b each have an electron-transport property, it is preferable that the first host material and the second host material each have an electron-transport property. It is more preferable that the electron-transport property of these materials be higher than a hole-transport property. However, the transport property of the light-emitting layer is also determined by the compatibility of the host materials and the guest material and thus is not limited to the above examples. Note that it is even more preferable that these host materials each have an electron mobility of $10^{-6}$ cm$^2$/Vs or higher.

It is also preferable that the difference between the LUMO levels of the first host material and the second host material be greater than or equal to 0.1 eV and less than or equal to 0.6 eV. When the difference between the LUMO levels is less than 0.1 eV, the electron-blocking effect is subtle. When the difference between the LUMO levels is greater than 0.6 eV, electron transport is too restricted, which may result in a rise in driving voltage or concentration of the recombination region in the vicinity of the interface between the first light-emitting layer 113a and the second light-emitting layer 113b.

As a preferable material satisfying the above requirements, a material having a six-membered aromatic ring can be given. It is particularly preferable to use a material in which the six-membered aromatic ring has a skeleton (an electron-transport skeleton) responsible for the electron-transport property of the material or a skeleton over which LUMO is distributed. A more appropriate structure can be obtained when the first host material has a small number of nitrogen atoms in the six-membered aromatic ring and the second host material has a large number of nitrogen atoms in the six-membered aromatic ring, because such materials each have favorable electron-transport property and the difference between the LUMO levels of the first light-emitting layer 113a and the second light-emitting layer 113b makes the recombination region dispersed.

In consideration of the compatibility of the first host material and the second host material to achieve such a structure, for example, a material having a benzene skeleton or a pyridine skeleton as the six-membered aromatic ring (i.e., a skeleton in which the number of nitrogen atoms included in the six-membered aromatic ring is 0 or 1) is preferably used as the first host material and a material having a diazine skeleton as the six-membered aromatic ring (i.e., a skeleton in which the number of nitrogen atoms included in the six-membered aromatic ring is 2) is preferably used as the second host material. Note that examples of the diazine skeleton include a pyrazine skeleton, a pyrimidine skeleton, and a pyridazine skeleton.

When the six-membered aromatic rings in the first host material and the second host material have nitrogen and the number of nitrogen atoms in the first host material is equal to the number of nitrogen atoms in the second host material, it is preferable that the six-membered aromatic ring in the first host material be monocyclic (i.e., a skeleton where an aromatic ring is not condensed) and that the six-membered aromatic ring in the second host material further have a condensed aromatic ring because the above conditions are favorably satisfied. As for a combination of such skeletons, a pyridine skeleton and a quinoline skeleton can be given can be given as the six-membered aromatic ring in the first host material and the six-membered aromatic ring in the second host material, respectively. Similarly, a combination of a pyrazine skeleton and a quinoxaline skeleton, a combination of a pyrimidine skeleton and a dibenzoquinoxaline skeleton, and the like can also be given. In this case, it is particularly preferable that the six-membered aromatic ring in the first host material and the six-membered aromatic ring in the second host material have the same skeleton (e.g., a combination of pyridine and quinoline or a combination of pyrazine and dibenzoquinoxaline) because the electron barrier between the first host material and the second host material becomes appropriate and stacked films formed using these materials have a favorable property.

Note that the LUMO level of a host material can be obtained in the following manner. First, the value of an ionization potential of a thin film of the material is measured in the air by photoelectron spectroscopy. The obtained value of the ionization potential is converted into a negative value to obtain a HOMO level. Then, using data on an absorption spectrum of the thin film, an optical energy gap in a solid state from an absorption edge obtained from a Tauc plot with an assumption of direct transition is estimated. From the previously obtained HOMO level and the energy gap, the LUMO level can be obtained.

The LUMO level can alternatively be obtained by cyclic voltammetry measurement of the material. A half-wave potential $E_{1/2}$ (an intermediate potential between $E_{pa}$ and $E_{pc}$) is calculated from the reduction peak potential $E_{pc}$ and the oxidation peak potential $E_{pa}$ obtained in measurement of reduction reaction, and the value of the half-wave potential $E_{1/2}$ can be subtracted from the potential energy of the reference electrode, which was used, with respect to the vacuum level.

Figure 2A:
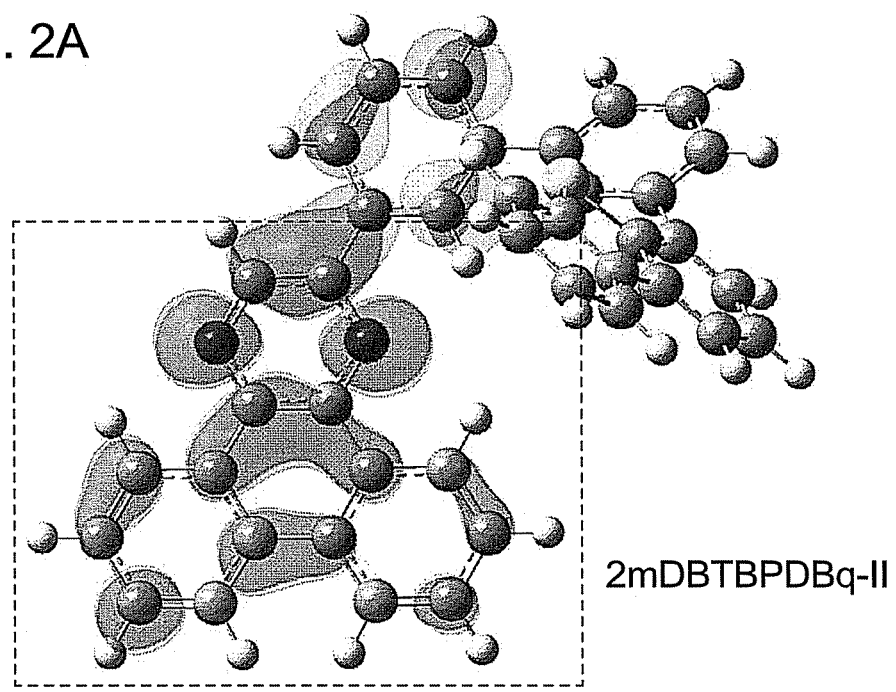
FIGS. 2A and 2B show calculated LUMO distributions of 2mDBTBPDBq-II and 2mDBTBPDBQu-II, respectively.
Figure 2B:
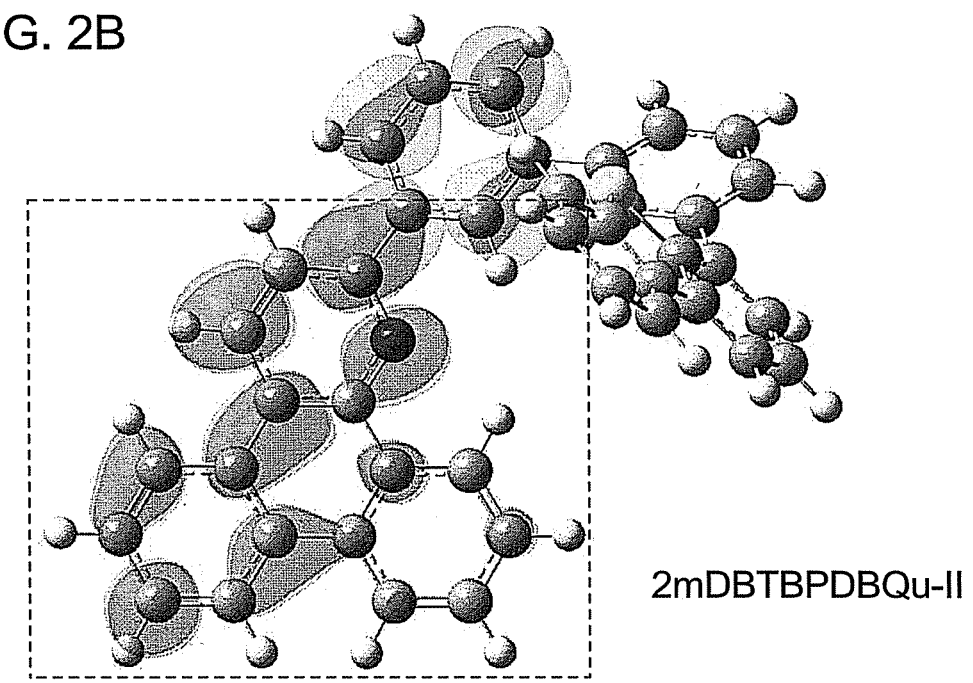

Further, the skeleton (the electron-transport skeleton) responsible for the electron-transport property of the host material, i.e., the skeleton over which LUMO is distributed, can be estimated by quantum chemical calculation. FIGS. 2A and 2B show examples of positions where LUMO exists in 2-[3'-(dibenzothiophen-4-yl)biphenyl-3-yl]dibenzo[f,h] quinoline (abbreviation: 2mDBTBPDBQu-II) having a quinoline skeleton having a pyridine skeleton and in 2-[3'-(dibenzothiophen-4-yl)biphenyl-3-yl]dibenzo[f,h]quinoxaline (abbreviation: 2mDBTBPDBq-II) having a dibenzoquinoxaline skeleton having a pyrazine skeleton, which are obtained by the quantum chemical calculation. Structural formulae of 2mDBTBPDBQu-II and 2mDBTBPDBq-II are shown below.

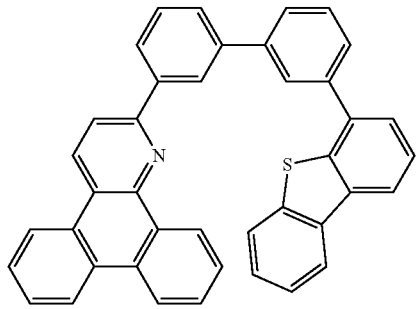

2mDBTBPDBQu-II

-continued

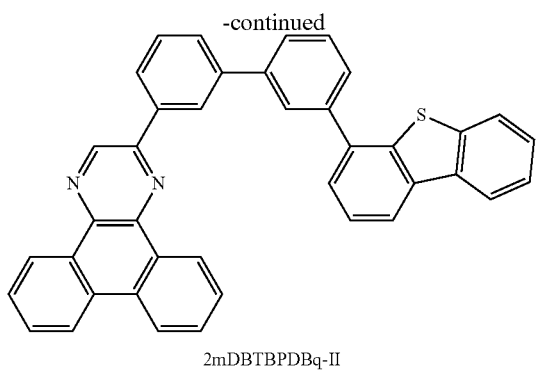

2mDBTBPDBq-II

In the calculation, molecular structures are optimized, and then molecular orbitals involved in transfer are analyzed. The density functional theory (DFT) using Gaussian basis is employed for the structure optimization calculation. In the DFT, an exchange-correlation interaction is approximated by a functional (a function of another function) of one electron potential represented in terms of electron density to enable high speed calculations. Here, B3LYP, which is a hybrid functional, is used to specify the weight of each parameter related to exchange-correlation energy. In addition, as a basis function, 6-311G (a basis function of a triple-split valence basis set using three contraction functions for each valence orbital) is applied to all the atoms. By the above basis function, for example, orbitals of 1s to 3s are considered in the case of hydrogen atoms while orbitals of 1s to 4s and 2p to 4p are considered in the case of nitrogen atoms. Furthermore, to improve calculation accuracy, the p function and the d function as polarization basis sets are added to hydrogen atoms and atoms other than hydrogen atoms, respectively, and the p orbital and the d orbital are considered.

Gaussian 09 is used as a quantum chemistry computational program. A high performance computer (manufactured by SGI Japan, Ltd., Altix 4700) is used for the calculations.

LUMO (lowest unoccupied molecular orbital) in the most stable structure was obtained by the structure optimization calculation. FIGS. 2A and 2B show the LUMO visualized by GaussView 5.0.8.

From FIGS. 2A and 2B, it was found that LUMO of 2-[3'-(dibenzothiophen-4-yl)biphenyl-3-yl]dibenzo[f,h]quinoline (abbreviation: 2mDBTBPDBQu-II) and LUMO of 2-[3'-(dibenzothiophen-4-yl)biphenyl-3-yl]dibenzo[f,h]quinoxaline (abbreviation: 2mDBTBPDBq-II) are distributed over the dibenzoquinoline skeleton and the dibenzoquinoxaline skeleton, respectively. The dibenzoquinoline skeleton can be referred to as a skeleton having a six-membered aromatic ring having one nitrogen atom, and the dibenzoquinoxaline skeleton can be referred to as a skeleton having a six-membered aromatic ring having two nitrogen atoms.

In the above manner, it is possible to estimate the skeleton (the electron-transport skeleton) responsible for the electron-transport property of the host material, i.e., the skeleton over which LUMO is distributed.

Note that it is preferable that the host material do not have an aromatic amine skeleton in order to have a wide energy gap or a high T1 level. By using such a material, a phosphorescent material can be used as the guest material and a light-emitting element with favorable emission efficiency can be obtained. Also in order to increase an electron-transport property of the host material relatively, it is preferable that the host material do not have an aromatic amine skeleton which is a hole-transport skeleton. Further, in a case of fabricating an element by an evaporation method, it is preferable that the molecular weight of the host material be higher than or equal to 300 and lower than or equal to 2000.

(Guest Material (Emission Center Substance))

The first light-emitting layer 113a and the second light-emitting layer 113b may contain the same or different guest materials (see white circles and black circles in FIG. 1B), which serve as emission center substances dispersed in the host materials. When the first light-emitting layer 113a and the second light-emitting layer 113b contain different guest materials (different emission center substances), by adjusting the LUMO step between the host materials, the emission intensity of the emission center substances in the two layers can be finely balanced. However, when the first light-emitting layer 113a and the second light-emitting layer 113b contain different guest materials and a carrier balance changes over time, the emission intensity balance would also change. In this case, when the guest materials in the layers have different emission efficiency, luminance would change (increase or decrease). Therefore, in order to suppress such a change in luminance, the first light-emitting layer 113a and the second light-emitting layer 113b preferably contain the same guest material.

Further, it is preferable that the guest material be a material that can convert triplet excitation energy into light emission, such as phosphorescence or thermally activated delayed fluorescence, because an element with favorable emission efficiency can be obtained. Furthermore, it is preferable that the structure of this embodiment be used for a light-emitting element in which a guest material with a higher HOMO level than a host material is used. This is because the guest material traps holes, so that a light-emitting layer is likely to have an electron-transport property and is suitably used for the structure of this embodiment to have a strong effect of improving the lifetime. A phosphorescent iridium complex is suitable for such a guest material.

In the light-emitting element in this embodiment having the above structure, degradation due to the localization of the light-emitting region can be suppressed; therefore, a light-emitting element with a small degree of luminance degradation with accumulation of driving time (a long-lifetime light-emitting element) can be provided.

Embodiment 2

In this embodiment, an example of a detailed structure of the light-emitting element described in Embodiment 1 will be described below with reference to FIGS. 1A to 1C.

The light-emitting element of this embodiment includes an EL layer including a plurality of layers between a pair of electrodes. In this embodiment, the light-emitting element includes a first electrode 101, a second electrode 102, and an EL layer 103 between the first electrode 101 and the second electrode 102. Note that in this embodiment, the first electrode 101 functions as an anode and the second electrode 102 functions as a cathode. In other words, when voltage is applied between the first electrode 101 and the second electrode 102 such that the potential of the first electrode 101 is higher than that of the second electrode 102, light emission can be obtained.

In order to serve as an anode, the first electrode 101 is preferably formed using any of metals, alloys, conductive compounds, mixtures thereof, and the like which has a high work function (specifically, a work function of 4.0 eV or more). Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Such conductive metal oxide films are usually formed by a sputtering method, but may also be formed by application of a sol-gel method or the like. As an example of a formation method, a method is given in which a film of indium oxide-zinc oxide is formed by a sputtering method using a target obtained by addition of 1 wt % to 20 wt % of zinc oxide to indium oxide. Further, a film of indium oxide containing tungsten oxide and zinc oxide (IWZO) can be formed by a sputtering method using a target containing 0.5 wt % to 5 wt % of tungsten oxide and 0.1 wt % to 1 wt % of zinc oxide to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. Graphene can also be used. Note that by using any of later-described composite materials for a layer that is included in the EL layer 103 and is in contact with the first electrode 101, an electrode material can be selected regardless of the work function.

There is no particular limitation on a stacked structure of the EL layer 103 as long as the light-emitting layer 113 has the structure described in Embodiment 1. For example, the EL layer 103 can be formed with a hole-injection layer, a hole-transport layer, a light-emitting layer, an electron-transport layer, an electron-injection layer, a carrier-blocking layer, an intermediate layer, and the like in appropriate combination. In this embodiment, the EL layer 103 has a structure in which a hole-injection layer 111, a hole-transport layer 112, a light-emitting layer 113, an electron-transport layer 114, and an electron-injection layer 115 are stacked in this order over the first electrode 101. Specific materials to form each of the layers will be given below.

The hole-injection layer 111 contains a substance with a high hole-injection property. For the hole-injection layer 111, it is possible to use an acceptor substance which can take electrons from the adjacent hole-transport layer 112 and inject holes to the hole-transport layer 112 with voltage application. Specific examples of such a compound include a metal oxide having a Lewis acid property, such as a molybdenum oxide, a vanadium oxide, a ruthenium oxide, a tungsten oxide, or a manganese oxide; a halogen compound such as 7,7,8,8-tetracyano-2,3,5,6-tetrafluoroquinodimethane (abbreviation: $F_4$-TCNQ) or chloranil; and a cyano compound such as pirazino[2,3-f][1,10]phenanthroline-2,3-dicarbonitrile (abbreviation: PPDN) or dipyrazino[2,3-f:2',3'-h]quinoxaline-2,3,6,7,10,11-hexacarbonitrile (abbreviation: HAT-CN). Alternatively, it is possible to use a compound with such a high HOMO level that holes can be easily accepted from the first electrode 101. Specifically, the hole-injection layer 111 can be formed using a phthalocyanine-based compound such as phthalocyanine (abbreviation: $H_2Pc$) or copper phthalocyanine (abbreviation: CuPc), an aromatic amine compound having a phenylenediamine skeleton, such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a conductive high molecule to which acid is added, such as poly(ethylenedioxythiophene)/poly(styrenesulfonic acid) (PEDOT/PSS), or the like.

Alternatively, for the hole-injection layer 111, a composite material in which an acceptor substance is contained in a substance with a hole-transport property can be used. Note that when the composite material in which an acceptor substance is contained in a substance with a hole-transport property is used, a material for forming the electrode can be selected regardless of the work function of the electrode. In other words, besides a material having a high work function, a material having a low work function can also be used for the first electrode 101. Examples of the acceptor substance include the above-described halogen compound such as 7,7,8,8-tetracyano-2,3,5,6-tetrafluoroquinodimethane (abbreviation: $F_4$-TCNQ) or chloranil and the above-described cyano compound such as pirazino[2,3-f][1,10]phenanthroline-2,3-dicarbonitrile (abbreviation: PPDN) or dipyrazino[2,3-f:2',3'-h]quinoxaline-2,3,6,7,10,11-hexacarbonitrile (abbreviation: HAT-CN). In addition, a transition metal oxide having a Lewis acid property can be given. Further, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Above all, molybdenum oxide is particularly preferable because it is stable even in the atmospheric air, has a low hygroscopic property, and is easy to be handled.

As the substance having a hole-transport property used for the composite material, any of various organic compounds such as an aromatic amine compound, a carbazole derivative, aromatic hydrocarbon, and a high molecular compound (such as an oligomer, a dendrimer, and a polymer) can be used. It is preferable that the organic compound used for the composite material be an organic compound with a high hole-transport property. Specifically, a substance having a hole mobility of $10^{-6}$ cm$^2$/Vs or higher is preferably used. An organic compound that can be used as a substance with a hole-transport property for the composite material is specifically given below.

Examples of the aromatic amine compound include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specifically, examples of the carbazole derivative that can be used for the composite material include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)-triphenylamine (abbreviation: PCBNBB), 4,4'-diphenyl-4''-(9-phenyl-9-H-carbazol-3-yl)triphenylamine (abbreviation: PCBBi1BP), and bis(biphenyl-4-yl) [4'-(9-phenyl-9H-carbazol-3-yl)biphenyl-4-yl]amine (abbreviation: PCTBi1BP).

Other examples of the carbazole derivative that can be used for the composite material include a carbazole derivative that does not have an aromatic amine skeleton, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, 3,3'-bis(9-phenyl-9H-carbazole) (abbreviation: PCCP), 9-phenyl-3-[4-(10-phenyl-9-anthryl)phenyl]-9H-carbazole (abbreviation: PCzPA), or 9-{4-(9-H-9-phenylcarbazol-3-yl)-phenylyl}-phenanthrene (abbreviation: PCPPn). These carbazole derivatives are preferable in terms of a hole-transport property and a light-transmitting property.

Examples of the aromatic hydrocarbon that can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Alternatively, pentacene, coronene, or the like can be used. Thus, aromatic hydrocarbon which has a hole mobility of $1 \times 10^{-6}$ cm$^2$/Vs or higher and which has 14 to 42 carbon atoms is particularly preferable. In particular, aromatic hydrocarbon having a condensed aromatic hydrocarbon skeleton in which a polyacene structure is a tricyclic ring or a bicyclic ring is preferable in terms of a light-transmitting property and chemical stability. Specific examples of such a condensed aromatic hydrocarbon skeleton include naphthalene, phenanthrene, pyrene, triphenylene, chrysene, anthracene, and perylene.

Note that the aromatic hydrocarbon that can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), or poly[N,N'-bis(4-butylphenyl)-N,N-bis(phenyl)benzidine (abbreviation: poly-TPD) can be used.

The formation of the hole-injection layer makes the hole-injection property favorable; accordingly, a light-emitting element that is driven at a low voltage can be provided.

The hole-transport layer 112 contains a substance with a hole-transport property. Examples of the substance with a hole-transport property include an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), or 4-phenyl-4'-(9-phenylfluoren-9-yl)triphenylamine (abbreviation: BPAFLP); and an aromatic amine compound having a carbazole skeleton, such as 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)-triphenylamine (abbreviation: PCBNBB), 4,4'-diphenyl-4''-(9-phenyl-9-H-carbazol-3-yl)triphenylamine (abbreviation: PCBBi1BP), or bis(biphenyl-4-yl)[4'-(9-phenyl-9H-carbazol-3-yl)biphenyl-4-yl]amine (abbreviation: PCTBi1BP). The substances mentioned here have a high hole-transport property and generally have a hole mobility of $10^{-6}$ cm$^2$/Vs or higher. An organic compound given as an example of the substance with a hole-transport property in the composite material described above can also be used for the hole-transport layer 112. Moreover, a high molecular compound such as poly(N-vinylcarbazole) (abbreviation: PVK) or poly(4-vinyltriphenylamine) (abbreviation: PVTPA) can also be used. Note that the layer containing a substance with a hole-transport property is not limited to a single layer and may be formed of a stack of two or more layers containing any of the above substances.

The light-emitting layer 113 contains a light-emitting substance. Since the light-emitting layer 113 has the structure described in Embodiment 1, the light-emitting element in this embodiment can be a light-emitting element with a small degree of luminance degradation with accumulation of driving time (a long-lifetime light-emitting element). For the structure of the light-emitting layer 113, the description in Embodiment 1 is to be referred to.

There is no particular limitation on a material that can be used as the emission center substance in the light-emitting layer 113, and a variety of fluorescent or phosphorescent materials can be used.

Examples of the fluorescent material include N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); another material having an emission wavelength of greater than or equal to 450 nm, such as 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N''-(2-tert-butylanthracene-9,10-diyldi-4,1-phenylene)bis[N,N',N'-triphenyl-1,4-phenyle nediamine](abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N''',N'''-octaphenyldibenzo[g,p]chrysene-2,7,10,15-tetramine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]

quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

Examples of the phosphorescent material include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$), or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIr(acac)). Other examples include an organometallic iridium complex having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), or (acetylacetonato)bis(4,6-diphenylpyrimidinato)iridium(III) (abbreviation: Ir(dppm)$_2$(acac)); an organometallic iridium complex having a pyrazine skeleton, such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), or bis(2-phenylquinolinato-N,C$^{2'}$)iridium(III) acetylacetonate (abbreviation: Ir(pq)$_2$(acac)); and a rare earth metal complex such as tris(acetylacetonato) (monophenanthroline)terbium(III) (abbreviation: Tb(acac)$_3$(Phen)). Still other examples include an organometallic iridium complex having a pyrimidine skeleton, such as bis[4,6-bis(3-methylphenyl)pyrimidinato](diisobutylylmethano)iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(II) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); an organometallic iridium complex having a pyridine skeleton, such as tris(1-phenylisoquinolinato-N,C$^{2'}$)iridium(III) (abbreviation: Ir(piq)$_3$) or bis(1-phenylisoquinolinato-N,C$^{2'}$)iridium(III) acetylacetonate (abbreviation: Ir(piq)$_2$acac); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: Eu(DBM)$_3$(Phen)) or tris[1-(2-thenoyl)-3,3,3-trifluoroacetonato](monophenanthroline)europium(III) (abbreviation: Eu(TTA)$_3$(Phen)).

Instead of the above-described light-emitting materials, a known light-emitting material can be selected as appropriate.

Further, there is no particular limitation on a material that can be used as the first host material and the second host material, and a variety of carrier-transport materials may be selected in appropriate combination so that the element structure illustrated in FIGS. 1A to 1C can be obtained.

Examples include a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); an aromatic compound such as 4-[3-(triphenylen-2-yl)phenyl]dibenzothiophene (abbreviation: mDBTPTp-II) or 4-[3'-(triphenylen-2-yl)biphenyl-3-yl]dibenzothiophene (abbreviation: mDBTBPTp-II); a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 2-[4-(dibenzothiophen-4-yl)phenyl]-1-phenyl-1H-benzimidazole (abbreviation: DBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above-described substances, a heterocyclic compound having a diazine skeleton or a heterocyclic compound having a pyridine skeleton is preferable because the reliability is high. In particular, a heterocyclic compound having a diazine (e.g., pyrimidine or pyrazine) skeleton has a high electron-transport property and contributes to a reduction in driving voltage.

Other than the above-described host materials, a known substance can be used as the host material. Note that as the host material, when the emission center substance is a fluorescent compound, it is preferable to select a substance having a wider energy gap than the fluorescent compound; when the emission center substance is a phosphorescent compound, it is preferable to select a substance with a higher triplet level (with a wider energy gap between a ground state and a triplet excited state) than the phosphorescent compound.

The light-emitting layer 113 having the above-described structure can be formed by co-evaporation by a vacuum evaporation method, an inkjet method, a spin coating method, a dip coating method, or the like with a solution of the materials.

The electron-transport layer 114 contains a substance with an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly have a high electron-transport property and each have an electron mobility of $10^{-6}$ cm$^2$/Vs or higher. Note that any of the above-described host materials with an electron-transport property may be used for the electron-transport layer 114.

In addition, the electron-transport layer 114 is not limited to a single layer but may have a stacked structure of two or more layers formed of the above-described substances.

In addition, an electron-injection layer 115 may be provided in contact with the second electrode 102, between the electron-transport layer 114 and the second electrode 102. Examples of a material for the electron-injection layer 115 include an alkali metal, an alkaline earth metal, and a compound thereof, such as lithium fluoride (LiF), cesium fluoride (CsF), or calcium fluoride (CaF$_2$). For example, a layer that is formed using a substance with an electron-transport property and that contains an alkali metal, an alkaline earth metal, or a compound thereof can be used. Note that electron injection from the second electrode 102 is efficiently performed with the use of a layer that is formed with a substance with an electron-transport property and that contains an alkali metal or an alkaline earth metal as the electron-injection layer 115, which is preferable.

The second electrode 102 can be formed using a metal, an alloy, or an electrically conductive compound each having a low work function (specifically, 3.8 eV or lower), a mixture thereof, or the like. Specific examples of such a cathode material include an element belonging to Groups 1 or 2 in the periodic table such as an alkali metal like lithium (Li) or cesium (Cs), magnesium (Mg), calcium (Ca), or strontium (Sr), an alloy containing any of the metals (e.g., MgAg or AlLi), a rare earth metal such as europium (Eu) or ytterbium (Yb), and an alloy containing any of the metals. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these conductive materials can be formed by a sputtering method, an inkjet method, a spin coating method, or the like.

Any of various methods can be employed for forming the EL layer 103 regardless of whether it is a dry process or a wet process. For example, a vacuum evaporation method, an inkjet method, a spin coating method or the like may be employed. A different formation method may be employed for each electrode or each layer.

The electrode may be formed by a wet process using a sol-gel method, or by a wet method using a paste of a metal material. Alternatively, the electrode may be formed by a dry process such as a sputtering method or a vacuum evaporation method.

In the light-emitting element having the above-described structure, current flows due to a potential difference made between the first electrode 101 and the second electrode 102, a hole and an electron recombines in the light-emitting layer 113 which includes a substance with a high light-emitting property, and light is emitted. That is, a light-emitting region is formed in the light-emitting layer 113.

Light is extracted outside through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the aforementioned one. However, it is preferable that a light-emitting region where holes and electrons recombine be positioned away from the first electrode 101 and the second electrode 102 so as to prevent quenching due to the proximity of the light-emitting region and a metal used for electrodes and carrier-injection layers.

Further, in order that transfer of energy from an exciton generated in the light-emitting layer can be suppressed, the hole-transport layer and the electron-transport layer which are in contact with the light-emitting layer 113, particularly a carrier-transport layer in contact with a side closer to the light-emitting region in the light-emitting layer 113, is preferably formed using a substance having a wider band gap than the light-emitting substance contained in the light-emitting layer or the emission center substance contained in the light-emitting layer.

A light-emitting element in this embodiment may be fabricated over a substrate of glass, plastic, or the like. As for a manner of stacking layers over the substrate, layers may be sequentially stacked on the first electrode 101 side or sequentially stacked on the second electrode 102 side. In a light-emitting device, although one light-emitting element may be fabricated over one substrate, a plurality of light-emitting elements may be formed over one substrate. With a plurality of light-emitting elements fabricated over one substrate as described above, a lighting device in which elements are separated or a passive matrix light-emitting device can be manufactured. In addition, for example, a thin film transistor (TFT) may be formed over a substrate formed of glass, plastic, or the like, and a light-emitting element may be fabricated over an electrode electrically connected to the TFT. In this manner, an active matrix light-emitting device in which the TFT controls the drive of the light-emitting element can be manufactured. Note that there is no particular limitation on a structure of the TFT. Either a staggered TFT or an inverted staggered TFT may be employed. In addition, crystallinity of a semiconductor used for the TFT is not particularly limited either; an amorphous semiconductor or a crystalline semiconductor may be used. In addition, a driver circuit formed over a TFT substrate may be constructed from both n-channel and p-channel TFTs or from either n-channel TFTs or p-channel TFTs.

Note that this embodiment can be freely combined with any of the other embodiments.

Embodiment 3

This embodiment shows a light-emitting device including a light-emitting element described in Embodiments 1 and 2.

Figure 3A:
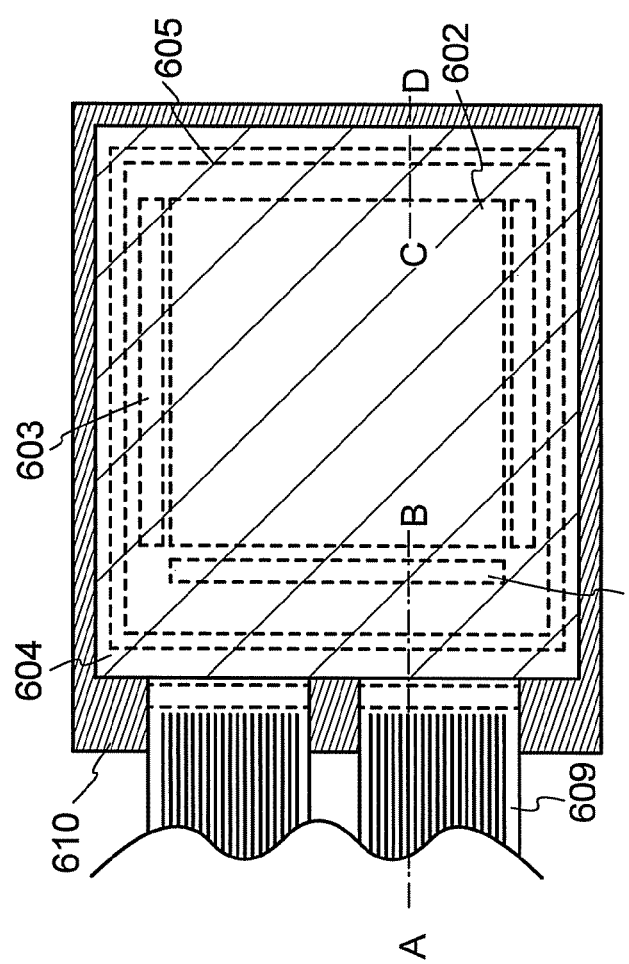
FIGS. 3A and 3B are conceptual diagrams of an active matrix light-emitting device.
Figure 3B:
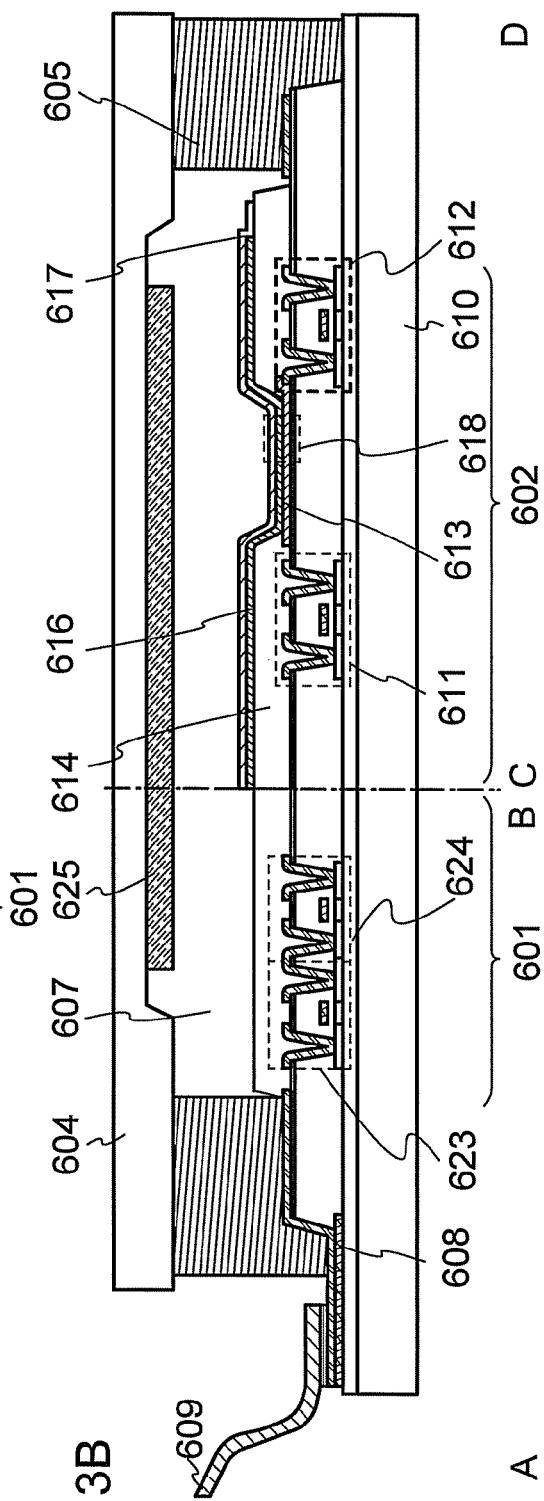

In this embodiment, the light-emitting device using the light-emitting element described in Embodiments 1 and 2 is described with reference to FIGS. 3A and 3B. Note that FIG. 3A is a top view illustrating the light-emitting device and FIG. 3B is a cross-sectional view of FIG. 3A taken along the lines A-B and C-D. The light-emitting device includes a driver circuit portion (source line driver circuit) 601, a pixel portion 602, and a driver circuit portion (gate line driver circuit) 603 which are illustrated with dotted lines. These units control light emission of the light-emitting element. Moreover, a reference numeral 604 denotes a sealing substrate; 605, a sealing material; and 607, a space surrounded by the sealing material 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Then, the cross-sectional structure is described with reference to FIG. 3B. The driver circuit portion and the pixel portion are formed over an element substrate 610. Here, the source line driver circuit 601, which is the driver circuit portion, and one pixel of the pixel portion 602 are shown.

In the source line driver circuit 601, a CMOS circuit is formed in which an n-channel TFT 623 and a p-channel TFT 624 are combined. Such a driver circuit may be formed by using various circuits such as a CMOS circuit, a PMOS circuit, or an NMOS circuit. Although this embodiment illustrates a driver-integrated type where the driver circuit is formed over the substrate, the present invention is not limited to this, and the driver circuit may be formed outside the substrate, not over the substrate.

The pixel portion 602 is formed with a plurality of pixels including a switching TFT 611, a current controlling TFT 612, and a first electrode 613 electrically connected to a drain of the current controlling TFT 612. An insulator 614 is formed to cover the end portions of the first electrode 613. Here, the insulator 614 is formed using a positive photosensitive acrylic resin film.

In order to improve the coverage, the insulator 614 is formed to have a curved surface with curvature at its upper or lower end portion. For example, in the case of using a positive photosensitive acrylic resin for the insulator 614, only the upper end portion of the insulator 614 preferably has a curved surface with a radius of curvature of 0.2 m to 0.3 µm. As the insulator 614, either a negative photosensitive resin or a positive photosensitive resin can be used.

Over the first electrode 613, an EL layer 616 and a second electrode 617 are formed. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like can be used. Alternatively, a stack of a titanium nitride film and a film containing aluminum as its main component, a stack of three layers of a titanium nitride film, a film containing aluminum as its main component, and a titanium nitride film, or the like can be used. The multilayer structure achieves to have low wiring resistance, favorable ohmic contact, and a function as an anode.

The EL layer 616 is formed by various methods such as an evaporation method using an evaporation mask, an inkjet method, a spin coating method, or the like. The EL layer 616 has the structure described in Embodiments 1 and 2. Further, the EL layer 616 may be formed using another material such as a low molecular weight compound or a polymer compound (a category of the polymer compound includes an oligomer and a dendrimer).

As a material used for the second electrode 617 which is formed over the EL layer 616 and serves as a cathode, it is preferable to use a low-work function material (e.g., Al, Mg, Li, Ca, or an alloy or compound thereof such as MgAg, Mg—In, or Al—Li). In the case where light generated in the EL layer 616 passes through the second electrode 617, the second electrode 617 is preferably formed using a stack of a thin metal film and a transparent conductive film (such as ITO, indium oxide containing zinc oxide at 2 wt % to 20 wt %, indium tin oxide containing silicon, zinc oxide (ZnO), or the like).

Note that the light-emitting element is formed by the first electrode 613, the EL layer 616, and the second electrode 617. The light-emitting element has the structure described in Embodiment 2. In the light-emitting device of this embodiment, the pixel portion, which includes a plurality of light-emitting elements, may include both the light-emitting element described in Embodiments 1 and 2 with the structure described in Embodiment 2 and a light-emitting element with a structure other than that.

Further, a light-emitting element 618 is provided in the space 607 surrounded with the element substrate 610, the sealing substrate 604, and the sealing material 605 by pasting the sealing substrate 604 and the element substrate 610 using the sealing material 605. The space 607 may be filled with filler, and may be filled with an inert gas (such as nitrogen or argon), the sealing material 605, or the like. It is preferable that the sealing substrate be provided with a depression and a drying agent 625 be provided in the depression, in which case degradation due to influence of moisture can be suppressed.

An epoxy-based resin or glass frit is preferably used for the sealing material 605. A material used for these is desirably a material which does not transmit moisture or oxygen as much as possible. As a material for the sealing substrate 604, a plastic substrate made of FRP (fiberglass-reinforced plastics), PVF (polyvinyl fluoride), polyester, acrylic, or the like can be used besides a glass substrate or a quartz substrate.

In this manner, it is possible to obtain the light-emitting device fabricated using the light-emitting element described in Embodiments 1 and 2.

Since the light-emitting device in this embodiment is fabricated using the light-emitting element described in Embodiments 1 and 2, a light-emitting device having favorable characteristics can be provided. Specifically, since the light-emitting element described in Embodiments 1 and 2 has high emission efficiency, a light-emitting device with low power consumption can be provided. In addition, a light-emitting element can be driven with a low driving voltage, and accordingly a light-emitting device driven with a low driving voltage can be provided.

Figure 4A:
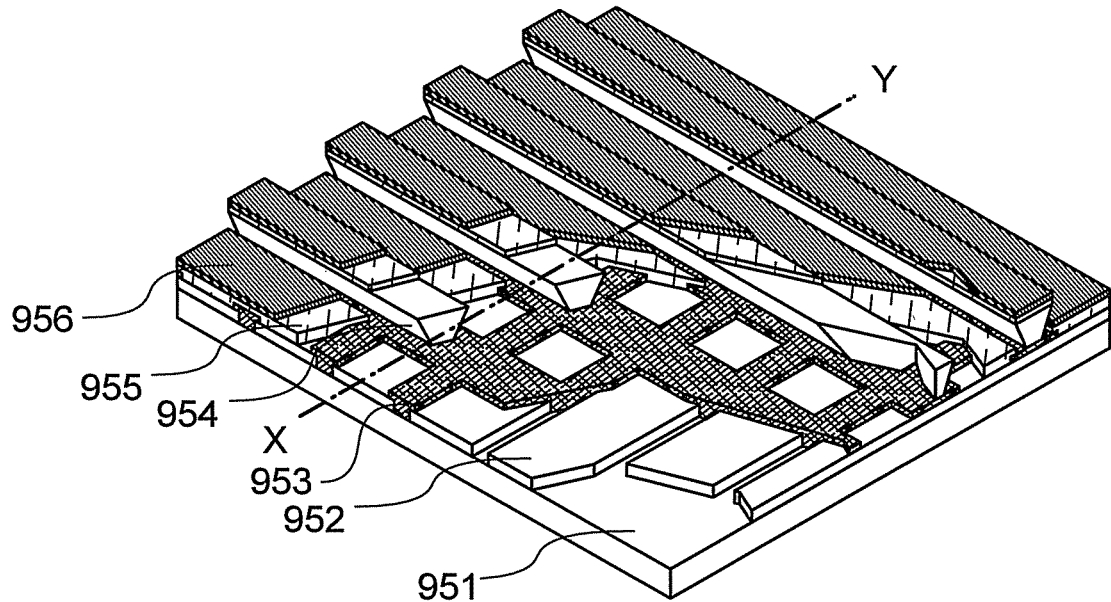
FIGS. 4A and 4B are conceptual diagrams of a passive matrix light-emitting device.
Figure 4B:
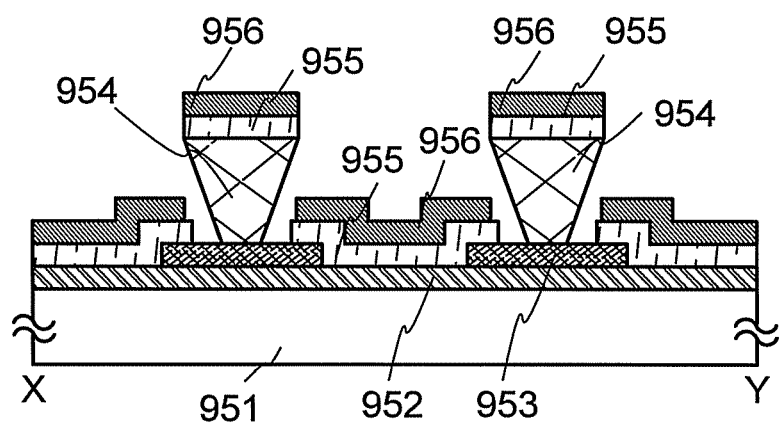

Although an active matrix light-emitting device is described in this embodiment as described above, a passive matrix light-emitting device may alternatively be manufactured. FIGS. 4A and 4B illustrate a passive matrix light-emitting device manufactured according to the present invention. FIG. 4A is a perspective view of the light-emitting device, and FIG. 4B is a cross-sectional view taken along line X-Y in FIG. 4A. In FIGS. 4A and 4B, an EL layer 955 is provided over a substrate 951 and between an electrode 952 and an electrode 956. An edge portion of the electrode 952 is covered with an insulating layer 953. A partition layer 954 is provided over the insulating layer 953. The sidewalls of the partition layer 954 are a slope such that the distance between both sidewalls is gradually narrowed toward the surface of the substrate. In other words, a cross section taken along the direction of the short side of the partition layer 954 is trapezoidal, and the base (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). By providing the partition layer 954 in this manner, defects of the light-emitting element due to static charge and the like can be prevented. The passive matrix light-emitting device can also be driven with low power consumption by including the light-emitting element described in Embodiments 1 and 2 capable of operating at a low voltage. In addition, the light-emitting device can be driven with low power consumption by including the light-emitting element described in Embodiments 1 and 2. Further, the light-emitting device can have high reliability by including the light-emitting element described in Embodiments 1 and 2.

Figure 5A:
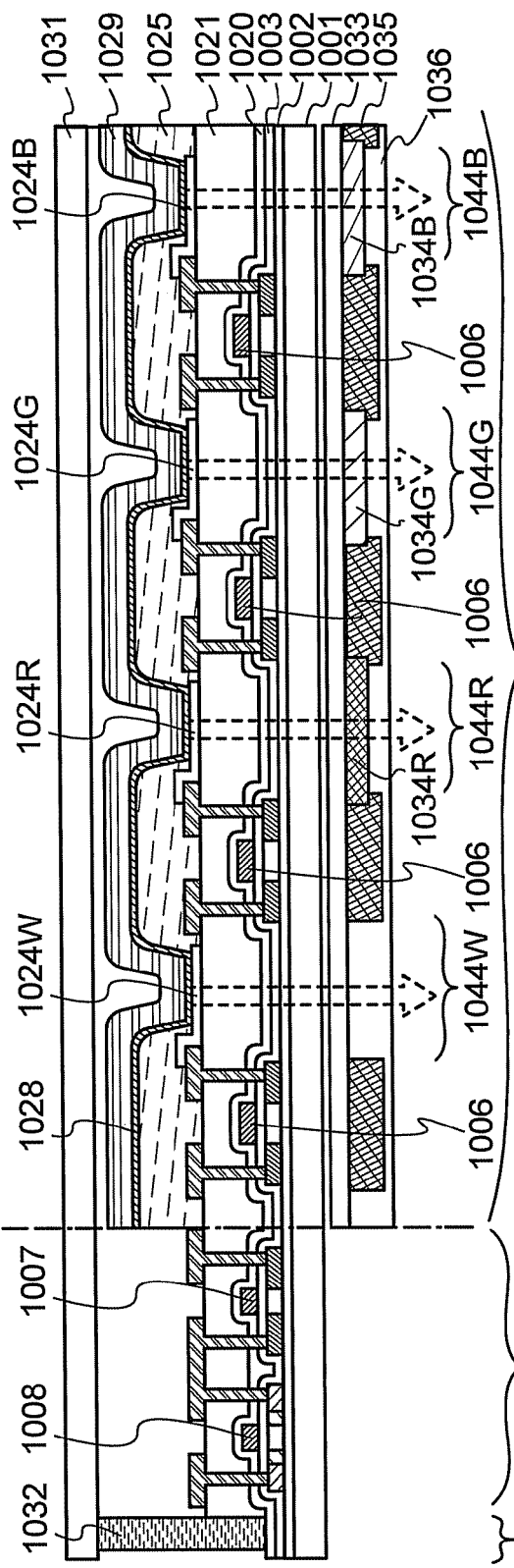
FIGS. 5A and 5B are conceptual diagrams of an active matrix light-emitting device.
Figure 5B:
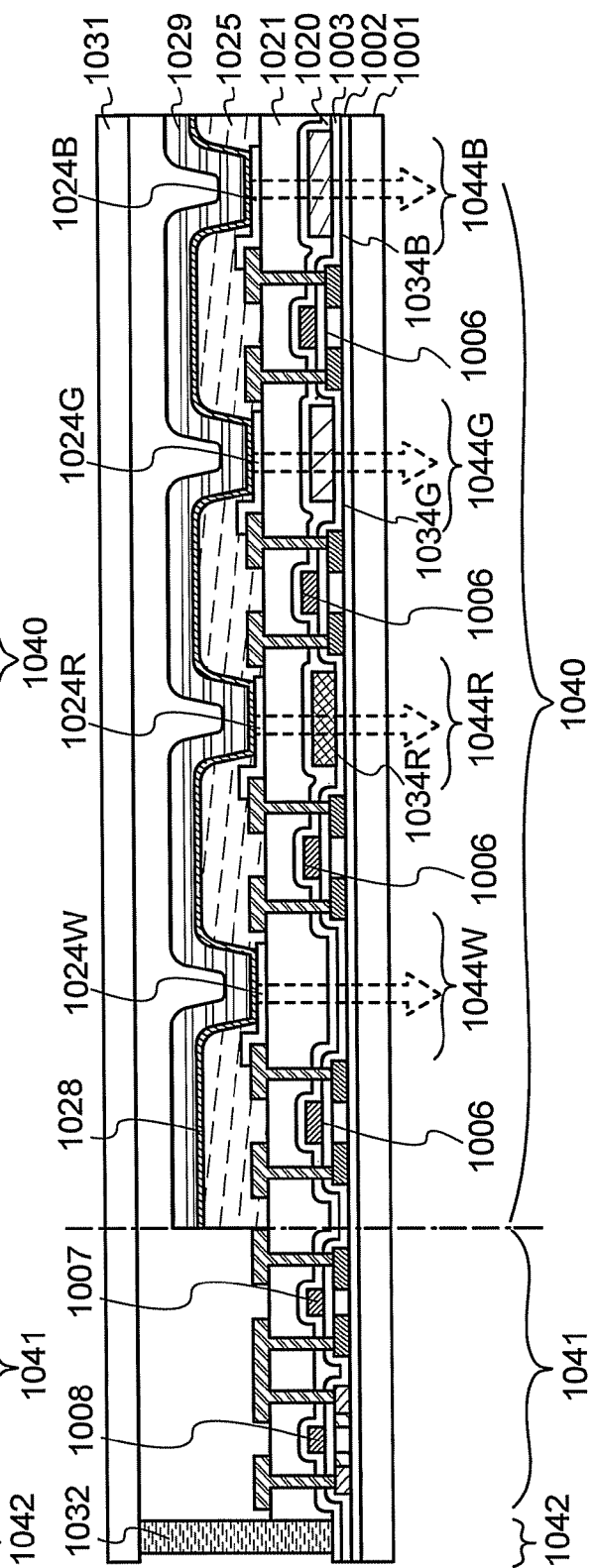

Further, for performing full color display, a coloring layer or a color conversion layer may be provided in a light path through which light from the light-emitting element passes to the outside of the light-emitting device. An example of a light-emitting device which realizes full color display by including a coloring layer and the like is illustrated in FIGS. 5A and 5B. In FIG. 5A, a substrate 1001, a base insulating film 1002, a gate insulating film 1003, gate electrodes 1006 to 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, a layer 1028 containing an organic compound; a second electrode 1029 of the light-emitting elements, a sealing substrate 1031, a sealing material 1032, and the like are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In this embodiment, light emitted from some of the light-emitting layers is emitted outside without passing through the coloring layer, while light emitted from the other of the light-emitting layers is emitted outside after passing through the coloring layer. Since light which does not pass through the coloring layer is white and light which passes through any one of the coloring layers is red, blue, or green; images can be displayed with pixels of the four colors.

Figure 6:
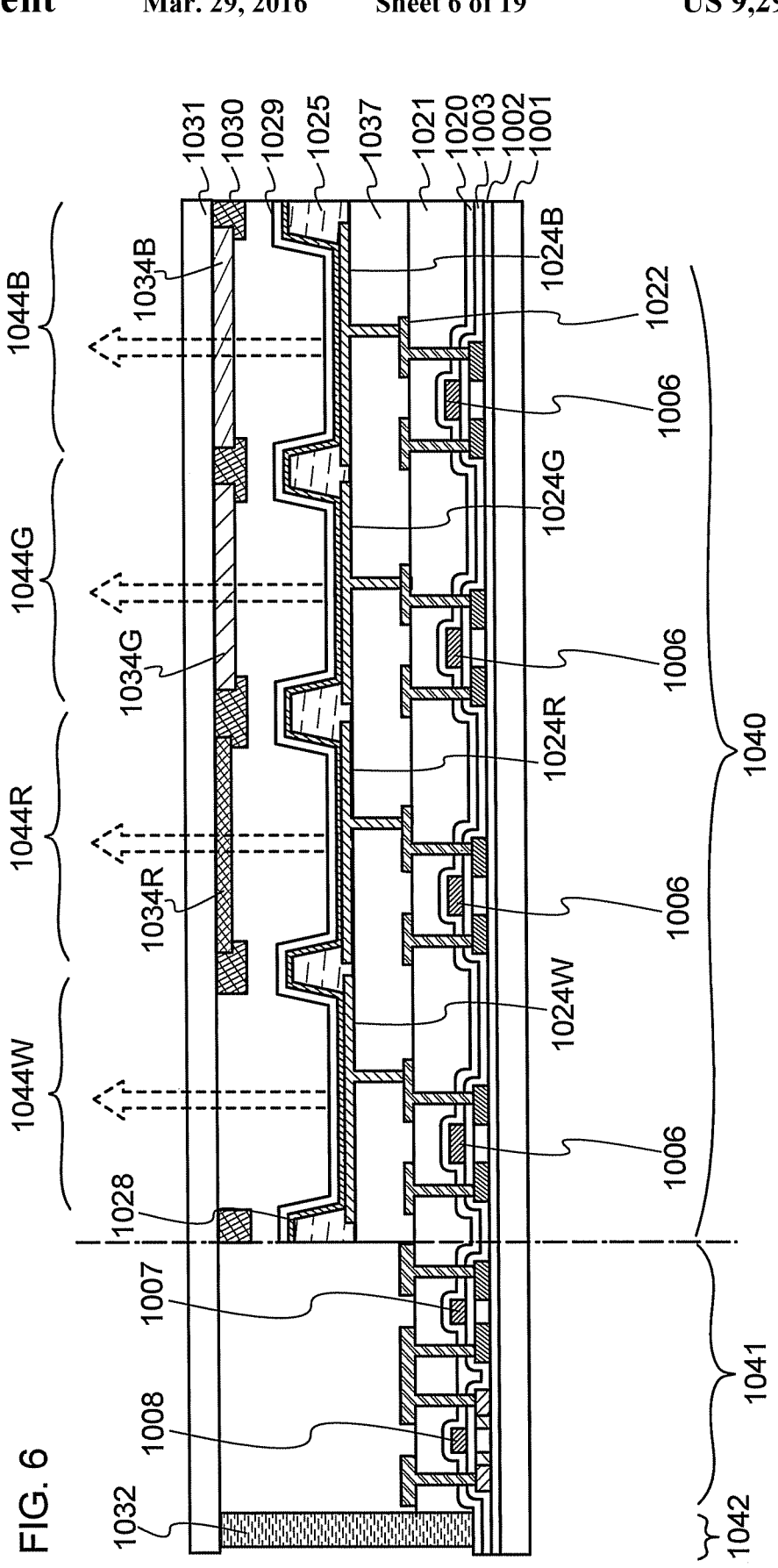
FIG. 6 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. The third interlayer insulating film may have a planarization function. The third interlayer insulating film 1037 can be formed using a material similar to that of the second interlayer insulating film, and can alternatively be formed using any other known material.

The first electrodes 1024W, 1024R, 1024Q and 1024B of the light-emitting elements each serve as an anode here, but may serve as a cathode. Further, in the case of a light-emitting device having a top emission structure as illustrated in FIG. 6, the first electrodes are preferably reflective electrodes. The layer 1028 containing an organic compound is formed to have a structure similar to the structure described in Embodiment 1, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Needless to say, the structure with which white light emission is obtained is not limited thereto as long as the structure described in Embodiments 1 and 2 is used.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with a black layer (a black matrix) 1030 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiments 1 and 2; thus, a light-emitting device with low power consumption can be achieved.

Further, although an example in which full color display is performed using four colors of red, green, blue, and white is shown here, there is no particular limitation and full color display using three colors of red, green, and blue may be performed.

This embodiment can be freely combined with any of other embodiments.

Embodiment 4

Figure 7A:
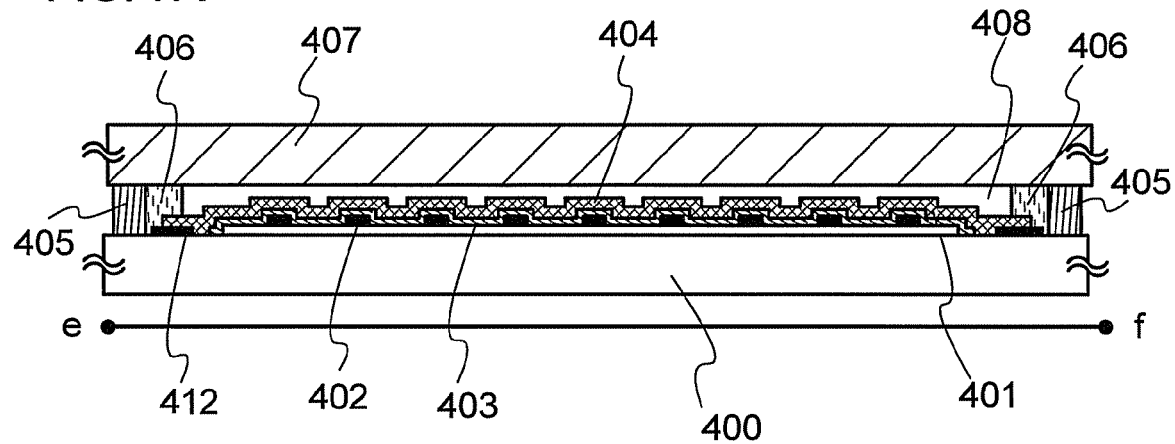
FIGS. 7A and 7B are conceptual diagrams of a lighting device.
Figure 7B:
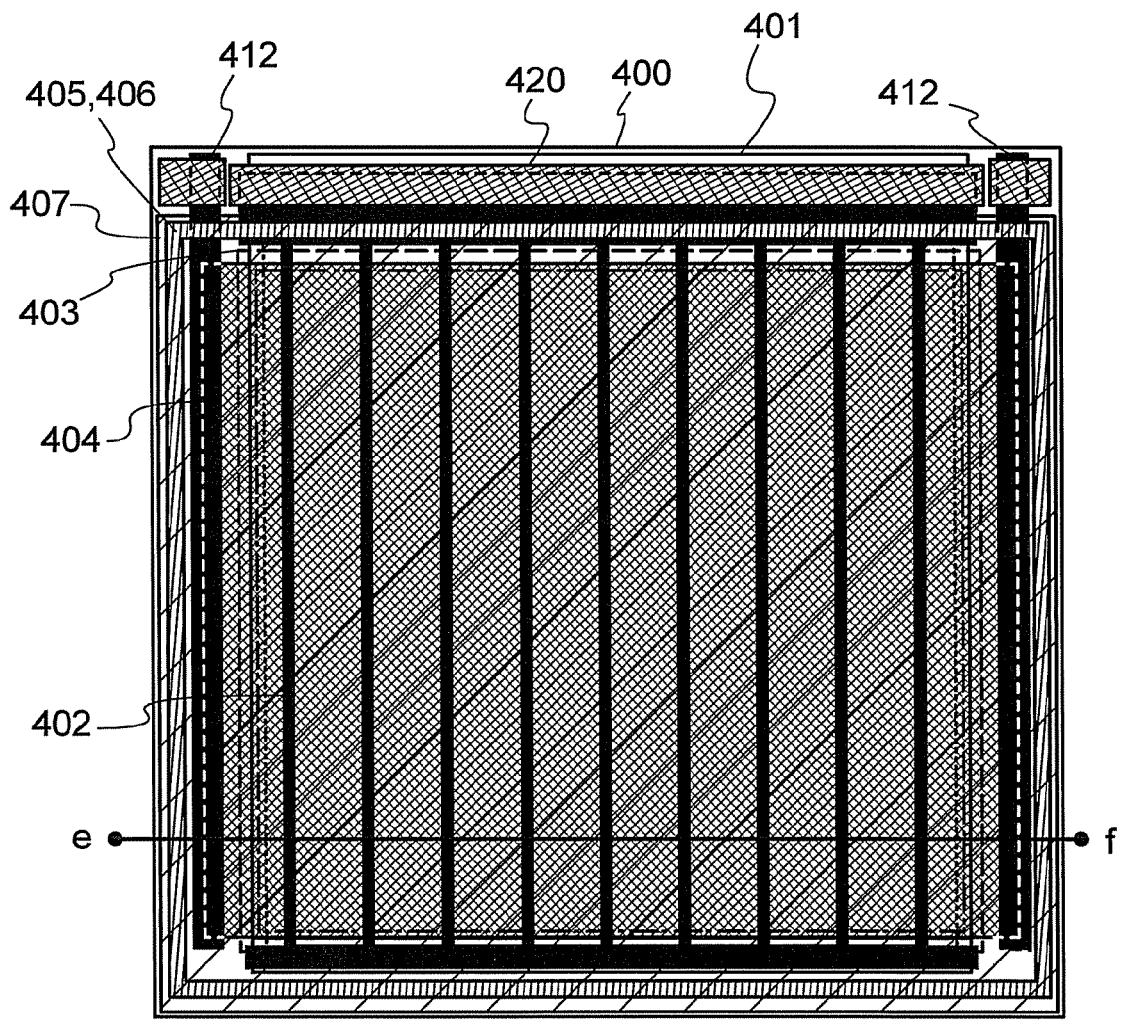

This embodiment shows an example in which the light-emitting element described in Embodiments 1 and 2 is used for a lighting device with reference to FIGS. 7A and 7B. FIG. 7B is a top view of the lighting device, and FIG. 7A is a cross-sectional view taken along line e-f in FIG. 7B.

In the lighting device in this embodiment, a first electrode 401 is formed over a substrate 400 which is a support and has a light-transmitting property. The first electrode 401 corresponds to the first electrode 101 in Embodiments 1 and 2.

An auxiliary electrode 402 is provided over the first electrode 401. Since this embodiment shows an example in which light emission is extracted through the first electrode 401 side, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that in the case of the light-emitting device having a bottom emission structure, surfaces of the auxiliary electrode 402 other than a portion thereof in contact with the first electrode 401 are preferably covered with an insulating layer. This is for suppressing light emission over the upper portion of the auxiliary electrode 402, which cannot be extracted, for reducing a reactive current, and for suppressing a reduction in power efficiency. Note that a pad 412 for applying voltage to a second electrode 404 may be formed at the same time as the formation of the auxiliary electrode 402.

An EL layer 403 is formed over the first electrode 401 and the auxiliary electrode 402. The EL layer 403 has the structure described in Embodiments 1 and 2. For these structures, the corresponding description is to be referred to. Note that the EL layer 403 is preferably formed to be slightly larger than the first electrode 401 when seen from above so as to also serve as an insulating layer that suppresses a short circuit between the first electrode 401 and the second electrode 404.

The second electrode 404 is formed to cover the EL layer 403. The second electrode 404 corresponds to the second electrode 102 in Embodiments 1 and 2 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element has high emission efficiency, the lighting device in this embodiment can be a lighting device with low power consumption. In addition, since the light-emitting element has high reliability, the lighting device in this embodiment can be a lighting device with high reliability.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 can be mixed with a desiccant, whereby moisture is adsorbed and the reliability is increased. A space 408 surrounded by the sealing substrate 407, the substrate 400 over which the light-emitting element is formed, and the sealing materials 405 and 406 may be vacuum or in a reduced pressure atmosphere. Alternatively, the space 408 may be filled with a gas such as air which does not contain moisture and oxygen or dry nitrogen, or a liquid or a solid such as a sealing material.

When extended to the outside of the sealing materials 405 and 406, the pad 412, the first electrode 401, and the auxiliary electrode 402 can each partly serve as external input terminal. An IC chip 420 mounted with a converter or the like may be provided over the external input terminals.

As described above, since the lighting device described in this embodiment includes a light-emitting element described in Embodiments 1 and 2 as an EL element, the lighting device can be a lighting device with low power consumption. Further, the lighting device can be a lighting device driven at a low driving voltage. Further, the lighting device can be a lighting device with high reliability.

Embodiment 5

In this embodiment, examples of electronic appliances each including the light-emitting element described in Embodiments 1 and 2 will be described. The light-emitting element described in Embodiments 1 and 2 is a light-emitting element with a small degree of luminance degradation with accumulation of driving time (a long-lifetime light-emitting element). As a result, the electronic appliances described in this embodiment can each include a light-emitting portion with high reliability.

Examples of the electronic appliances in which the above light-emitting element is used include television devices (also referred to as TV or television receivers), monitors for computers and the like, cameras such as digital cameras and digital video cameras, digital photo frames, cellular phones (also referred to as mobile phones or mobile phone devices), portable game machines, portable information terminals, audio playback devices, large game machines such as pin-ball machines, and the like. Specific examples of these electronic appliances are described below.

FIG. 8A illustrates an example of a television device. In the television device, a display portion 7103 is incorporated in a housing 7101. In addition, here, the housing 7101 is supported by a stand 7105. The display portion 7103 enables display of images and includes light-emitting elements each of which is described in Embodiments 1 and 2 and which are arranged in a matrix. The light-emitting elements can be light-emitting elements with a small degree of luminance degradation with accumulation of driving time (long-lifetime light-emitting elements); accordingly, the television device including the display portion 7103 including the light-emitting elements can be a television device with high reliability.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 8B1 illustrates a computer, which includes a main body 7201, a housing 7202, a display portion 7203, a keyboard 7204, an external connection port 7205, a pointing device 7206, and the like. Note that this computer is manufactured using light-emitting elements arranged in a matrix in the display portion 7203, which are the same as that described in Embodiments 1 and 2. The computer illustrated in FIG. 8B1 may have a structure illustrated in FIG. 8B2. A computer illustrated in FIG. 8B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touch screen. Connecting the two screens with a hinge can prevent troubles; for example, the screens can be prevented from being cracked or broken while the computer is being stored or carried. Note that this computer is manufactured using the light-emitting elements each of which is described in Embodiments 1 and 2 and which are arranged in a matrix in the display portion 7203. The light-emitting elements can be light-emitting elements with a small degree of luminance degradation with accumulation of driving time (long-lifetime light-emitting elements); accordingly, the computer including the display portion 7203 including the light-emitting elements can be a computer with high reliability.

FIG. 8C illustrates a portable game machine, which includes two housings, a housing 7301 and a housing 7302, which are connected with a joint portion 7303 so that the portable game machine can be opened or folded. A display portion 7304 including the light-emitting elements each of which is described in Embodiments 1 and 2 and which are arranged in a matrix is incorporated in the housing 7301, and a display portion 7305 is incorporated in the housing 7302. In addition, the portable game machine illustrated in FIG. 8C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above structure as long as the display portion including the light-emitting elements each of which is described in Embodiments 1 and 2 and which are arranged in a matrix is used as at least either the display portion 7304 or the display portion 7305, or both, and the structure can include other accessories as appropriate. The portable game machine illustrated in FIG. 8C has a function of reading out a program or data stored in a recording medium to display it on the display portion, and a function of sharing information with another portable game machine by wireless communication. The portable game machine in FIG. 8C can have a variety of functions without limitation to the above functions. The light-emitting element used for the display portion 7304 is a light-emitting element with a small degree of luminance degradation with accumulation of driving time (a long-lifetime light-emitting element); accordingly, the portable game machine including the above-described display portion 7304 can be a portable game machine with high reliability.

FIG. 8D illustrates an example of a mobile phone. The mobile phone is provided with a display portion 7402 incorporated in a housing 7401, operation buttons 7403, an external connection port 7404, a speaker 7405, a microphone 7406, and the like. Note that a mobile phone 7400 includes the display portion 7402 manufactured using the light-emitting elements each of which is described in Embodiments 1 and 2 and which are arranged in a matrix. The light-emitting elements can be light-emitting elements with a small degree of luminance degradation with accumulation of driving time (long-lifetime light-emitting elements); accordingly, the mobile phone including the display portion 7402 including the light-emitting elements can be a mobile phone with high reliability.

When the display portion 7402 of the mobile phone illustrated in FIG. 8D is touched with a finger or the like, data can be input into the mobile phone. In this case, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be inputted. In this case, it is preferable to display a keyboard or number buttons on almost all the area of the screen of the display portion 7402.

When a detection device which includes a sensor for detecting inclination, such as a gyroscope or an acceleration sensor, is provided inside the mobile phone, the direction of the mobile phone (whether the mobile phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device, including the light-emitting elements each of which is described in Embodiments 1 and 2 is extremely wide; therefore, the light-emitting device can be used for electronic appliances of a variety of fields. By using the light-emitting element described in Embodiments 1 and 2, an electronic appliance with high reliability can be obtained.

Figure 9:
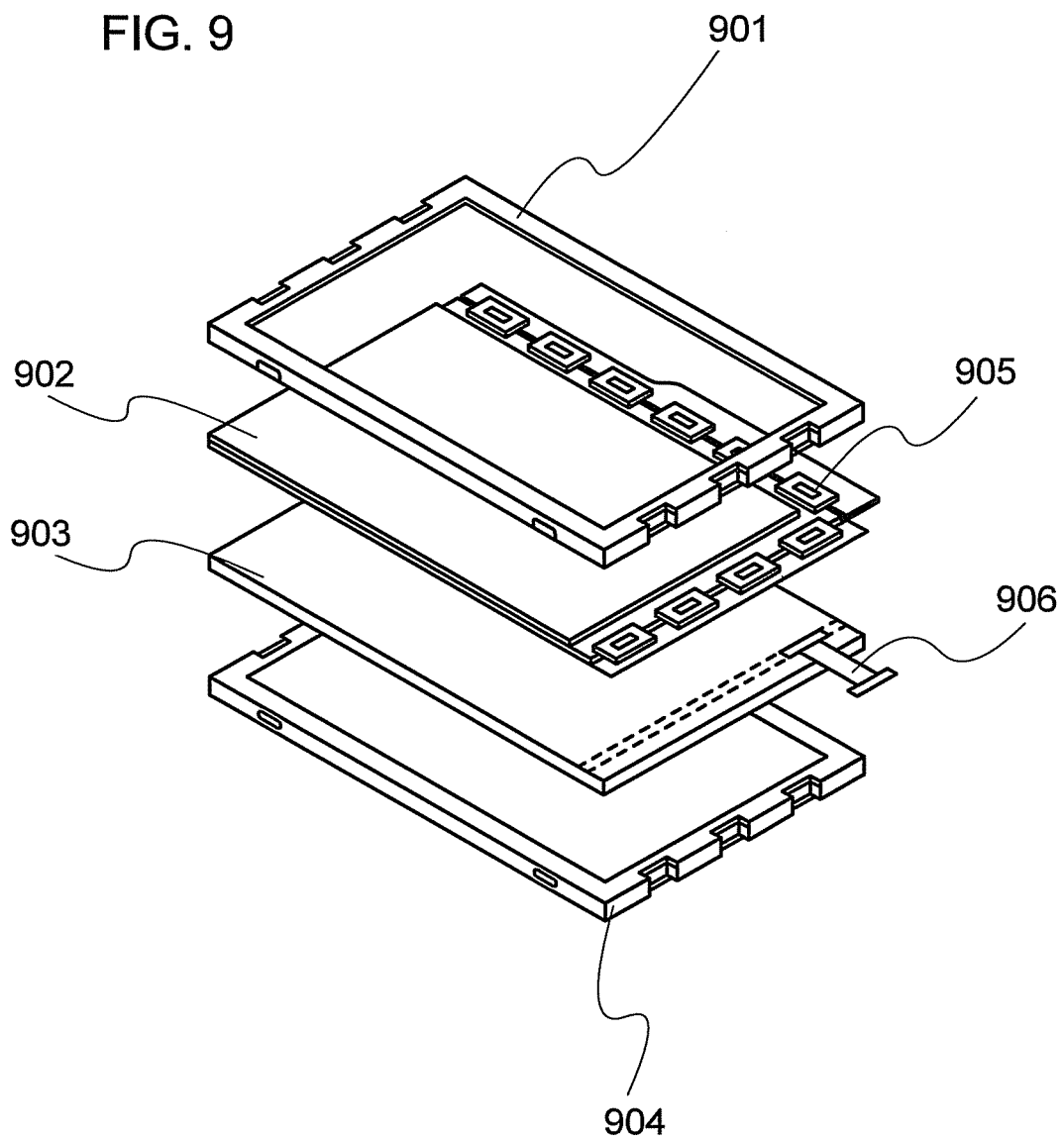
FIG. 9 illustrates an electronic appliance.

FIG. 9 illustrates an example of a liquid crystal display device using the light-emitting element described in Embodiments 1 and 2 for a backlight. The liquid crystal display device illustrated in FIG. 9 includes a housing 901, a liquid crystal layer 902, a backlight unit 903, and a housing 904. The liquid crystal layer 902 is connected to a driver IC 905. The light-emitting element described in Embodiments 1 and 2 is used in the backlight unit 903, to which current is supplied through a terminal 906.

The light-emitting element described in Embodiments 1 and 2 is used for the backlight of the liquid crystal display device; thus, a backlight with high reliability can be obtained. By using the light-emitting element described in Embodiments 1 and 2, a planar lighting device can be manufactured, and the area can be increased. Thus, the area of the backlight can be increased, and the area of the liquid crystal display device can also be increased. Furthermore, a light-emitting device fabricated using the light-emitting element described in Embodiments 1 and 2 can be thinner than a conventional one; accordingly, the display device can also be thinner.

Figure 10:
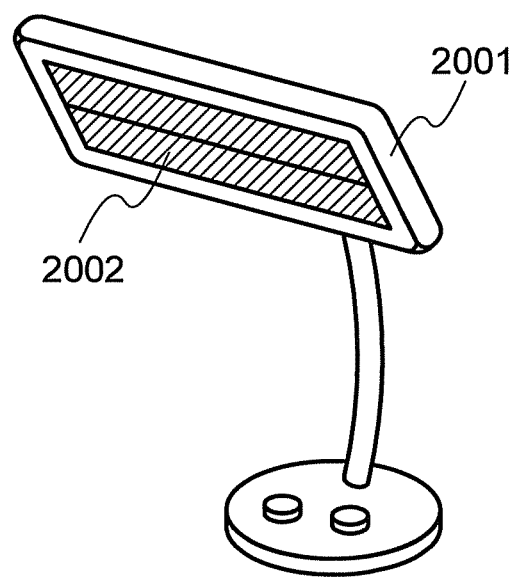
FIG. 10 illustrates a lighting device.

FIG. 10 illustrates an example in which the light-emitting element described in Embodiments 1 and 2 is used for a table lamp which is a lighting device. The table lamp illustrated in FIG. 10 includes a housing 2001 and a light source 2002, and a light-emitting device fabricated using the light-emitting element described in Embodiments 1 and 2 is used as the light source 2002.

Figure 11:
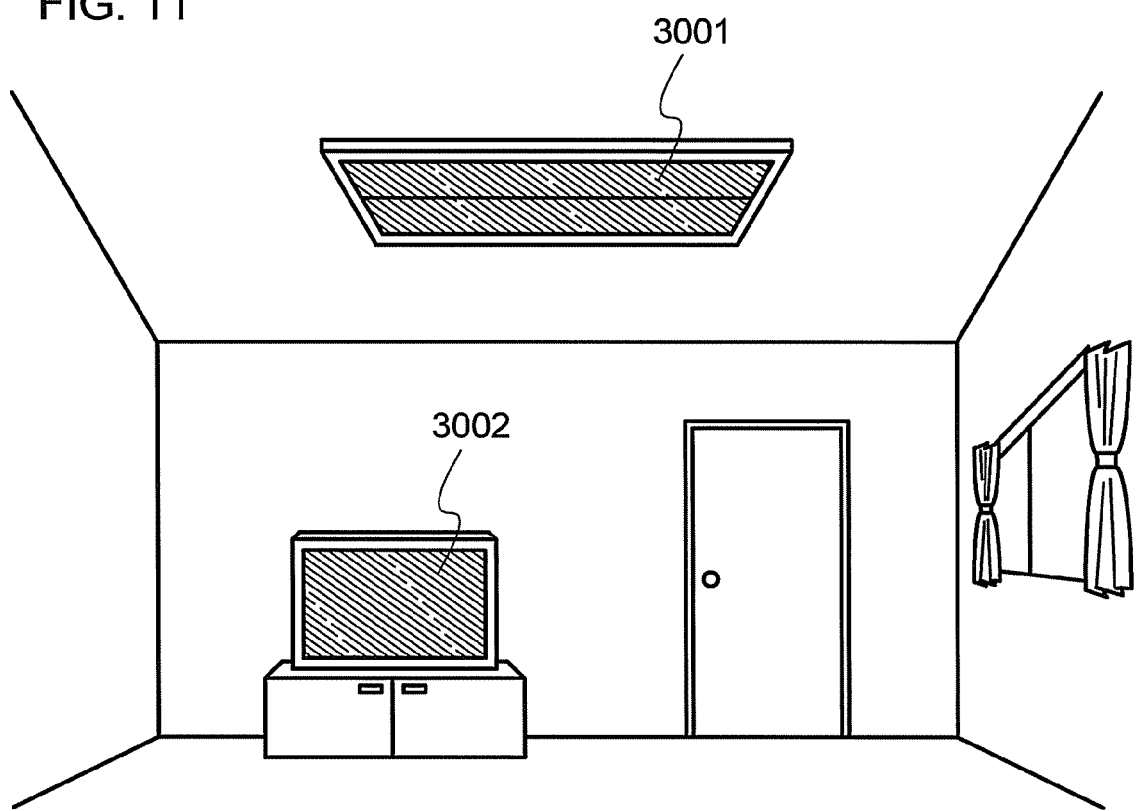
FIG. 11 illustrates a lighting device.

FIG. 11 illustrates an example in which the light-emitting element described in Embodiments 1 and 2 is used for an indoor lighting device 3001 and a display device 3002. The light-emitting element described in Embodiments 1 and 2 is a light-emitting element with a small degree of luminance degradation with accumulation of driving time (a long-lifetime light-emitting element); accordingly, a lighting device with high reliability can be provided. Further, since the light-emitting element described in Embodiments 1 and 2 can have a large area, the light-emitting element can be used for a large-area lighting device. Furthermore, since the light-emitting element described in Embodiments 1 and 2 is thin, the light-emitting element can be used for a lighting device with a reduced thickness.

Figure 12:
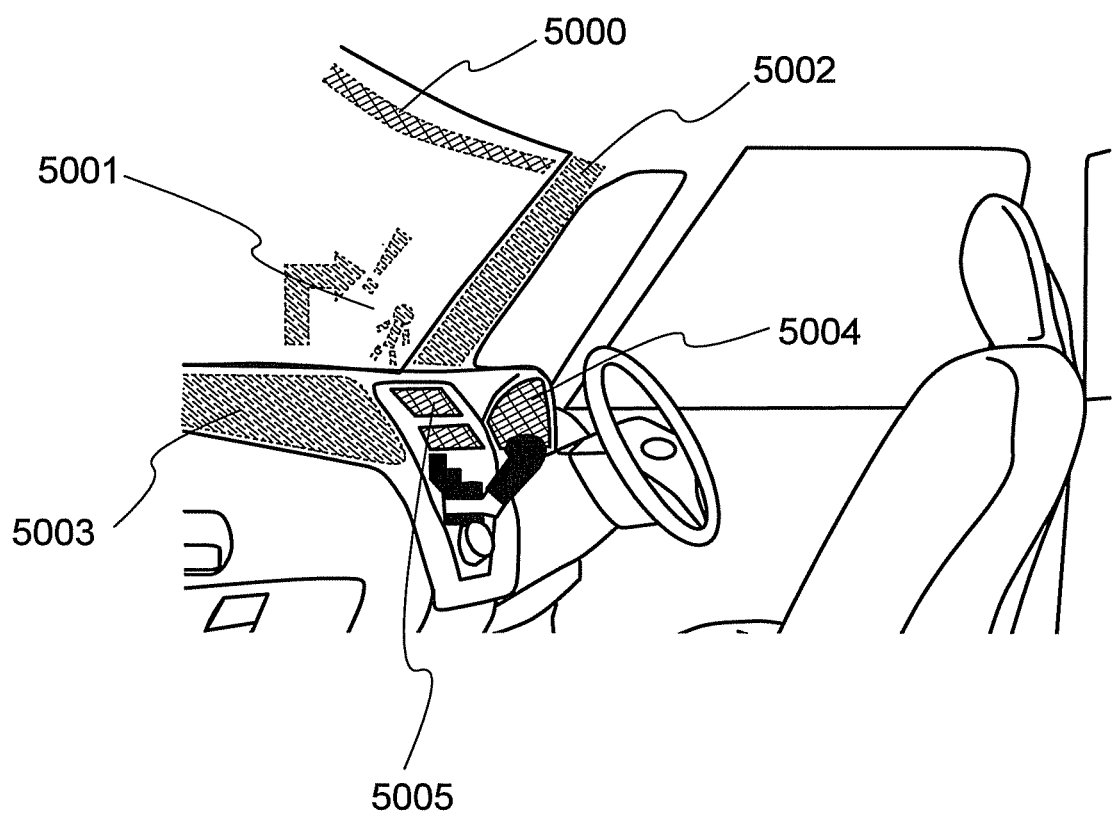
FIG. 12 illustrates in-car display devices and lighting devices.

The light-emitting element described in Embodiments 1 and 2 can also be used for an automobile windshield or an automobile dashboard. FIG. 12 illustrates one mode in which the light-emitting element described in Embodiments 1 and 2 is used for an automobile windshield and an automobile dashboard. Display regions 5000 to 5005 each include the light-emitting element described in Embodiments 1 and 2.

The display regions 5000 and 5001 are display devices which are provided in the automobile windshield and in which light-emitting elements each of which is described in Embodiments 1 and 2 are incorporated. The light-emitting element described in Embodiments 1 and 2 can be formed into what is called a see-through display device, through which the opposite side can be seen, by including a first electrode and a second electrode formed with electrodes having a light-transmitting property. It is preferable that such a see-through display device be provided even in the automobile windshield or used as a head-up display (HUD) on a plane, without hindering the vision. Note that, for example, when a transistor for driving the light-emitting element is provided, it is more preferable to use a transistor having a light-transmitting property, such as an organic transistor using an organic semiconductor material or a transistor using an oxide semiconductor.

A display device incorporating the light-emitting element described in Embodiments 1 and 2 is provided in the display region 5002 in a pillar portion. The display region 5002 can compensate for the view hindered by a pillar by showing an image taken by an imaging unit provided in the car body. Similarly, the display region 5003 provided in a dashboard portion can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The content or layout of the display can be changed freely by a user as appropriate. Further, such information can also be shown by the display regions 5000 to 5003. Note that the display regions 5000 to 5005 can also be used as lighting devices.

The light-emitting element described in Embodiments 1 and 2 can be a light-emitting element with a small degree of luminance degradation with accumulation of driving time (a long-lifetime light-emitting element). Thus, the light-emitting element can be favorably used for an in-car light-emitting device or lighting device with high safety requirements.

FIGS. 13A and 13B illustrate an example of a foldable tablet terminal. In FIG. 13A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. Note that in the tablet terminal, one or both of the display portion 9631a and the display portion 9631b is/are formed using a light-emitting device which includes a light-emitting element described in Embodiments 1 and 2.

Part of the display portion 9631a can be a touch screen region 9632a and data can be input when a displayed operation key 9637 is touched. Note that FIG. 13A shows, as an example, that half of the area of the display portion 9631a has only a display function and the other half of the area has a touch screen function. However, the structure of the display portion 9631a is not limited to this, and all the area of the display portion 9631a may have a touch screen function. For example, all the area of the display portion 9631a can display keyboard buttons and serve as a touch screen while the display portion 9631b can be used as a display screen.

Like the display portion 9631a, part of the display portion 9631b can be a touch screen region 9632b. A switching button 9639 for showing/hiding a keyboard of the touch screen is touched with a finger, a stylus, or the like, so that keyboard buttons can be displayed on the display portion 9631b.

Touch input can be performed in the touch screen region 9632a and the touch screen region 9632b at the same time.

The display-mode switching button 9034 can switch display orientation (e.g., between landscape mode and portrait mode) and select a display mode (switch between monochrome display and color display), for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Note that FIG. 13A shows an example in which the display portion 9631a and the display portion 9631b have the same display area; however, without limitation, one of the display portions may be different from the other display portion in size and display quality. For example, one of them may be a display panel that can display higher-definition images than the other.

FIG. 13B illustrates the tablet terminal which is folded. The tablet terminal includes the housing 9630, a solar battery 9633, a charge/discharge control circuit 9634, a battery 9635, and a DCDC converter 9636. Note that in FIG. 13B, a structure including the battery 9635 and the DCDC converter 9636 is illustrated as an example of the charge/discharge control circuit 9634.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 13A and 13B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch screen, a display portion, an image signal processor, and the like. Note that the solar battery 9633 can be provided on one or both surfaces of the housing 9630 and the battery 9635 can be charged efficiently.

The structure and the operation of the charge/discharge control circuit 9634 illustrated in FIG. 13B are described with reference to a block diagram in FIG. 13C. FIG. 13C illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge/discharge control circuit 9634 in FIG. 13B.

First, an example of operation when power is generated by the solar battery 9633 using external light is described. The voltage of power generated by the solar battery is raised or lowered by the DCDC converter 9636 so that the power has a voltage for charging the battery 9635. Then, when power from the solar battery 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar battery 9633 is described as an example of a power generation means, there is no particular limitation on the power generation means, and the battery 9635 may be charged by another power generation means such as a piezoelectric element or a thermoelectric conversion element (Peltier element). The battery 9635 may be charged by a non-contact power transmission module which is capable of charging by transmitting and receiving power by wireless (without contact), or another charge means used in combination, and the power generation means is not necessarily provided.

One embodiment of the present invention is not limited to the tablet terminal having the shape illustrated in FIGS. 13A to 13C as long as the display portion 9631 is included.

Example 1

In Example 1, light-emitting elements according to embodiments of the present invention (light-emitting elements 1 to 3) and a comparative light-emitting element 1 will be described with reference to FIGS. 1A and 1B. Chemical formulae of materials used in this example are shown below. Note that each of the light-emitting elements 1 to 3 includes a light-emitting layer having a two-layer structure containing different host materials; a light-emitting layer on a cathode side of the two layers in the light-emitting layer contains a host material with a lower LUMO level than a host material in a light-emitting layer on an anode side. Note that in the comparative light-emitting element 1, a light-emitting layer on a cathode side and a light-emitting layer on an anode side contain the same host material.

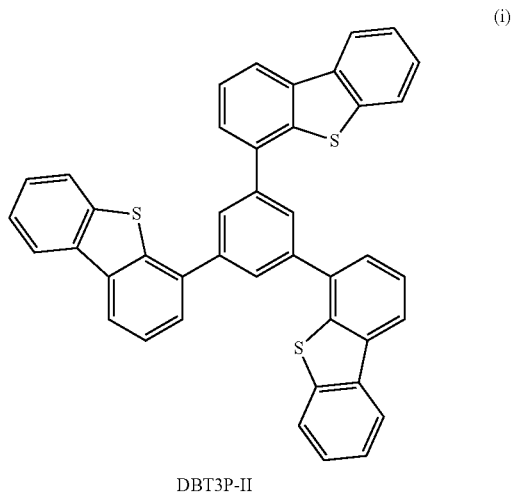

(i)

DBT3P-II

-continued (ii)

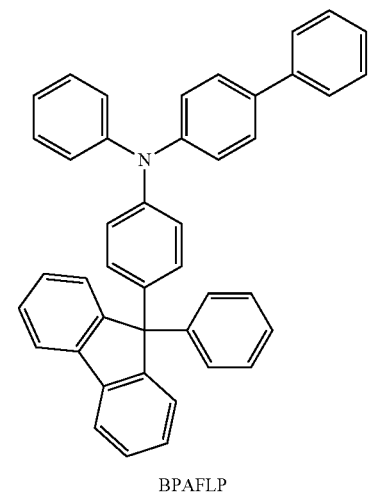

BPAFLP (iii)

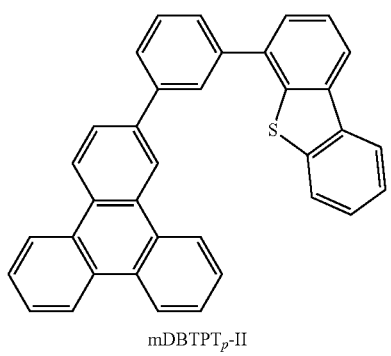

mDBTPT$_p$-II (iv)

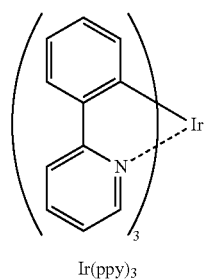

Ir(ppy)$_3$ (v)

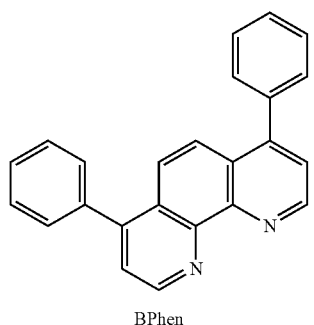

BPhen

-continued

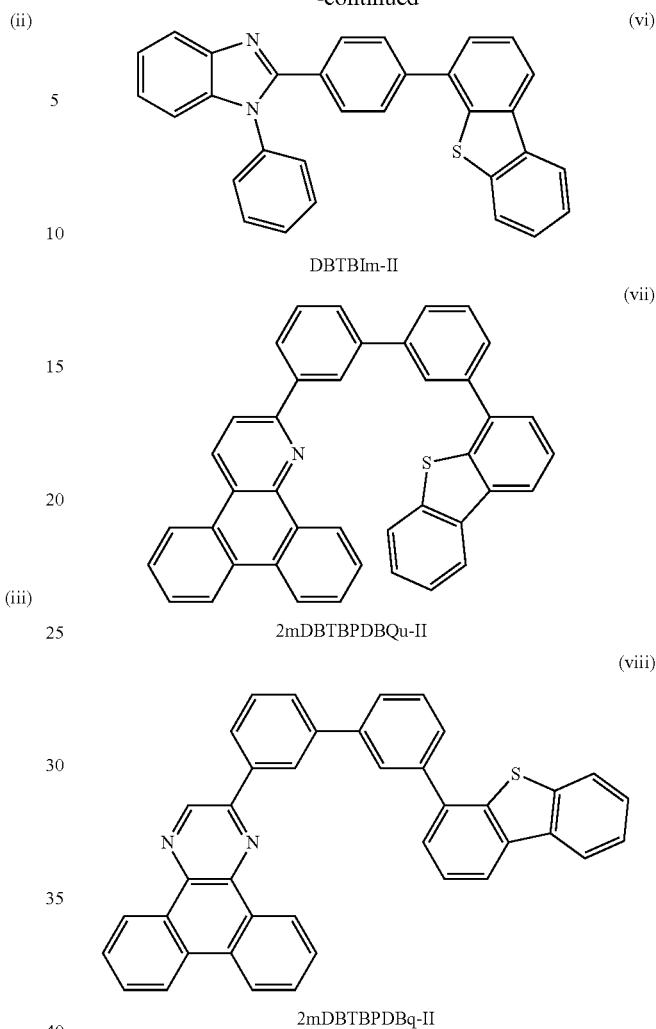

(vi) DBTBIm-II (vii) 2mDBTBPDBQu-II (viii) 2mDBTBPDBq-II

A method for fabricating the light-emitting elements 1 to 3 of this example and the comparative light-emitting element 1 will be described below.

(Method for Fabricating Light-Emitting Elements 1 to 3 and Comparative Light-Emitting Element 1)

First, a film of indium tin oxide containing silicon oxide (ITSO) was formed over a glass substrate by a sputtering method, so that the first electrode 101 was formed. The thickness of the first electrode 101 was 110 nm and the electrode area was 2 mm×2 mm. Here, the first electrode 101 is an electrode that serves as an anode of the light-emitting element.

Next, as pretreatment for forming the light-emitting element over the substrate, a surface of the substrate was washed with water, baked at 200° C. for one hour, and subjected to UV ozone treatment for 370 seconds.

After that, the substrate was transferred into a vacuum evaporation apparatus whose pressure was reduced to about $10^{-4}$ Pa, vacuum baking at 170° C. for 30 minutes was performed in a heating chamber in the vacuum evaporation apparatus, and then the substrate was cooled down for about 30 minutes.

Then, the substrate over which the first electrode 101 was formed was fixed to a substrate holder provided in the vacuum evaporation apparatus such that the surface on which the first electrode 101 was formed faced downward. The pressure in the vacuum evaporation apparatus was reduced to about $10^{-4}$ Pa. After that, over the first electrode 101, 4,4',4''-(benzene-1,3,5-triyl)tri(dibenzothiophene) (abbreviation: DBT3P-II) represented by the above structural formula (i) and molybdenum(VI) oxide were co-evaporated by an evaporation method using resistance heating, so that the hole-injection layer 111 was formed. The thickness of the hole-injection layer 111 was 40 nm, and the weight ratio of DBT3P-II to molybdenum oxide was adjusted to 4:1 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) represented by the above structural formula (ii) was formed to a thickness of 20 nm over the hole-injection layer 111 to form the hole-transport layer 112.

Further, over the hole-transport layer 112, 4-[3-(triphenylen-2-yl)phenyl]dibenzothiophene (abbreviation: mDBTPTp-II) represented by the above structural formula (iii) and tris(2-phenylpyridinato)iridium (abbreviation: Ir(ppy)$_3$) represented by the above structural formula (iv) were co-evaporated to a thickness of 20 nm with a weight ratio of 1:0.08 (=mDBTPTp-II:Ir(ppy)$_3$), so that the first light-emitting layer 113a was formed.

Then, for the light-emitting element 1, 2-[3'-(dibenzothiophen-4-yl)biphenyl-3-yl]dibenzo[f,h]quinoxaline (abbreviation: 2mDBTBPDBq-II) represented by the above structural formula (viii) and Ir(ppy)$_3$ were co-evaporated to a thickness of 20 nm with a weight ratio of 1:0.04 (=2mDBTBPDBq-II:Ir(ppy)$_3$), so that the second light-emitting layer 113b was formed. Thus, the light-emitting layer 113 was formed. Next, over the light-emitting layer 113, a film of 2mDBTBPDBq-II was formed to a thickness of 10 nm, and further, a film of bathophenanthroline (abbreviation: BPhen) represented by the above structural formula (v) was formed to a thickness of 20 nm, so that the electron-transport layer 114 was formed. Note that the LUMO level of 2mDBTBPDBq-II in a solution state is –2.94 eV, which is lower than the LUMO level of mDBTPTp-II in a solution state, –2.36 eV, by approximately 0.58 eV.

For the light-emitting element 2, over the hole-transport layer 112, mDBTPTp-II and Ir(ppy)$_3$ were co-evaporated to a thickness of 20 nm with a weight ratio of 1:0.08 (=mDBTPTp-II:Ir(ppy)$_3$), so that the first light-emitting layer 113a was formed. Then, 2-[4-(dibenzothiophen-4-yl)phenyl]-1-phenyl-1H-benzimidazole (abbreviation: DBTBIm-II) represented by the above structural formula (vi) and Ir(ppy)$_3$ were co-evaporated to a thickness of 20 nm with a weight ratio of 1:0.04 (=DBTBIm-II:Ir(ppy)$_3$), so that the second light-emitting layer 113b was formed. Thus, the light-emitting layer 113 was formed. Next, over the light-emitting layer 113, a film of DBTBIm-II was formed to a thickness of 10 nm, and further, a film of bathophenanthroline (abbreviation: BPhen) represented by the above structural formula (v) was formed to a thickness of 20 nm, so that the electron-transport layer 114 was formed. Note that the LUMO level of DBTBIm-II in a solution state is –2.52 eV, which is lower than the LUMO level of mDBTPTp-II in a solution state, –2.36 eV, by approximately 0.16 eV.

For the light-emitting element 3, over the hole-transport layer 112, mDBTPTp-II and Ir(ppy)$_3$ were co-evaporated to a thickness of 20 nm with a weight ratio of 1:0.08 (=mDBTPTp-II:Ir(ppy)$_3$), so that the first light-emitting layer 113a was formed. Then, 2-[3'-(dibenzothiophen-4-yl)biphenyl-3-yl]dibenzo[,h]quinoline (abbreviation: 2mDBTBPDBQu-II) represented by the above structural formula (vii) and Ir(ppy)$_3$ were co-evaporated to a thickness of 20 nm with a weight ratio of 1:0.04 (=2mDBTBPDBQu-II:Ir(ppy)$_3$), so that the second light-emitting layer 113b was formed. Thus, the light-emitting layer 113 was formed. Next, over the light-emitting layer 113, a film of 2mDBTBPDBQu-II was formed to a thickness of 10 nm, and further, a film of bathophenanthroline (abbreviation: BPhen) represented by the above structural formula (v) was formed to a thickness of 20 nm, so that the electron-transport layer 114 was formed. Note that the LUMO level of 2mDBTBPDBQu-II in a solution state is –2.59 eV, which is lower than the LUMO level of mDBTPTp-II in a solution state, –2.36 eV, by approximately 0.23 eV.

For the comparative light-emitting element 1, over the hole-transport layer 112, mDBTPTp-II and Ir(ppy)$_3$ were co-evaporated to a thickness of 20 nm with a weight ratio of 1:0.08 (=mDBTPTp-II:Ir(ppy)$_3$), so that the first light-emitting layer 113a was formed. Then, mDBTPTp-II and Ir(ppy)$_3$ were co-evaporated to a thickness of 20 nm with a weight ratio of 1:0.04 (=mDBTPTp-II:Ir(ppy)$_3$), so that the second light-emitting layer 113b was formed. Thus, the light-emitting layer 113 was formed. Next, over the light-emitting layer 113, a film of mDBTPTp-II was formed to a thickness of 10 nm, and further, a film of bathophenanthroline (abbreviation: BPhen) represented by the above structural formula (v) was formed to a thickness of 20 nm, so that the electron-transport layer 114 was formed.

After the electron-transport layer 114 was formed, lithium fluoride (LiF) was evaporated to a thickness of 1 nm to form the electron-injection layer 115.

Lastly, aluminum was evaporated to a thickness of 200 nm as the second electrode 102 serving as a cathode. Thus, the light-emitting elements 1 to 3 of this example and the comparative light-emitting element 1 were fabricated.

Note that in the above evaporation process, evaporation was all performed by a resistance heating method.

Further, the molecular weight of mDBTPTp-II is 486, that of 2mDBTBPDBq-II is 564, that of DBTBIm-II is 452, and that of 2mDBTBPDBQu-II is 563.

Table 1 shows element structures of the thus obtained light-emitting elements 1 to 3 and the comparative light-emitting element 1.

TABLE 1

| | Hole-injection Layer | Hole-transport Layer | Light-emitting Layer | | Electron-transport Layer | | Electron-injection Layer |
|---|---|---|---|---|---|---|---|
| | | | 1st Light-emitting Layer | 2nd Light-emitting Layer | 1st Electron-transport Layer | 2nd Electron-transport Layer | |
| Light-emitting Element 1 | DBT3P-II:MoOx 4:1 40 nm | BPAFLP 20 nm | mDBTPTp-II:Ir(ppy)3 1:0.08 20 nm | 2mDBTBPDBq-II:Ir(ppy)3 1:0.04 20 nm | 2mDBTBPDBq-II 10 nm | Bphen 20 nm | LiF 1 nm |

TABLE 1-continued

| | Hole-injection Layer | Hole-transport Layer | Light-emitting Layer | | Electron-transport Layer | | Electron-injection Layer |
| --- | --- | --- | --- | --- | --- | --- | --- |
| | | | 1st Light-emitting Layer | 2nd Light-emitting Layer | 1st Electron-transport Layer | 2nd Electron-transport Layer | |
| Light-emitting Element 2 | | | | DBTBIm-II:Ir(ppy)3 1:0.04 20 nm | DBTBIm-II 10 nm | | |
| Light-emitting Element 3 | | | | 2mDBTBPDBQu-II:Ir(ppy)3 1:0.04 20 nm | 2mDBTBPDBQu-II 10 nm | | |
| Comparative Light-emitting Element 1 | | | | mDBTPTp-II:Ir(ppy)3 1:0.04 20 nm | mDBTPTp-II 10 nm | | |

In a glove box containing a nitrogen atmosphere, the light-emitting elements 1 to 3 and the comparative light-emitting element 1 were each sealed with a glass substrate so as not to be exposed to the air (specifically, a sealing material was applied onto an outer edge of the element and heat treatment was performed at 80° C. for an hour at the time of sealing). Then, reliability of the light-emitting elements was measured. Note that the measurement was carried out at room temperature (in an atmosphere kept at 25° C.).

Figure 14:
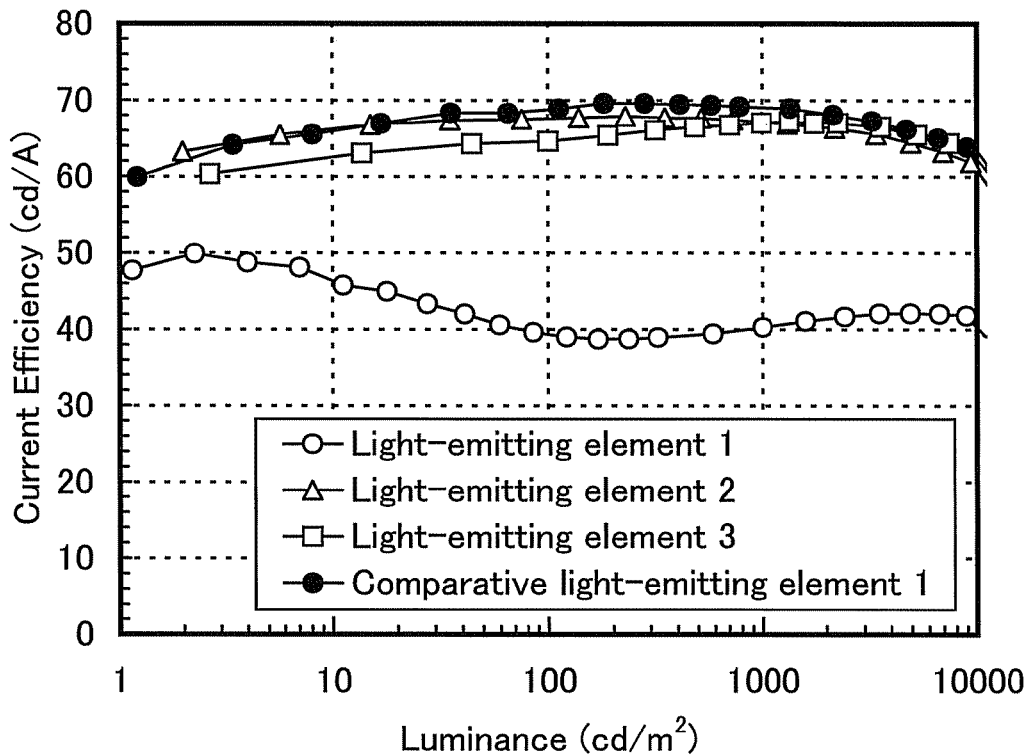
FIG. 14 shows luminance versus current efficiency characteristics of light-emitting elements 1 to 3 and a comparative light-emitting element 1.
Figure 15:
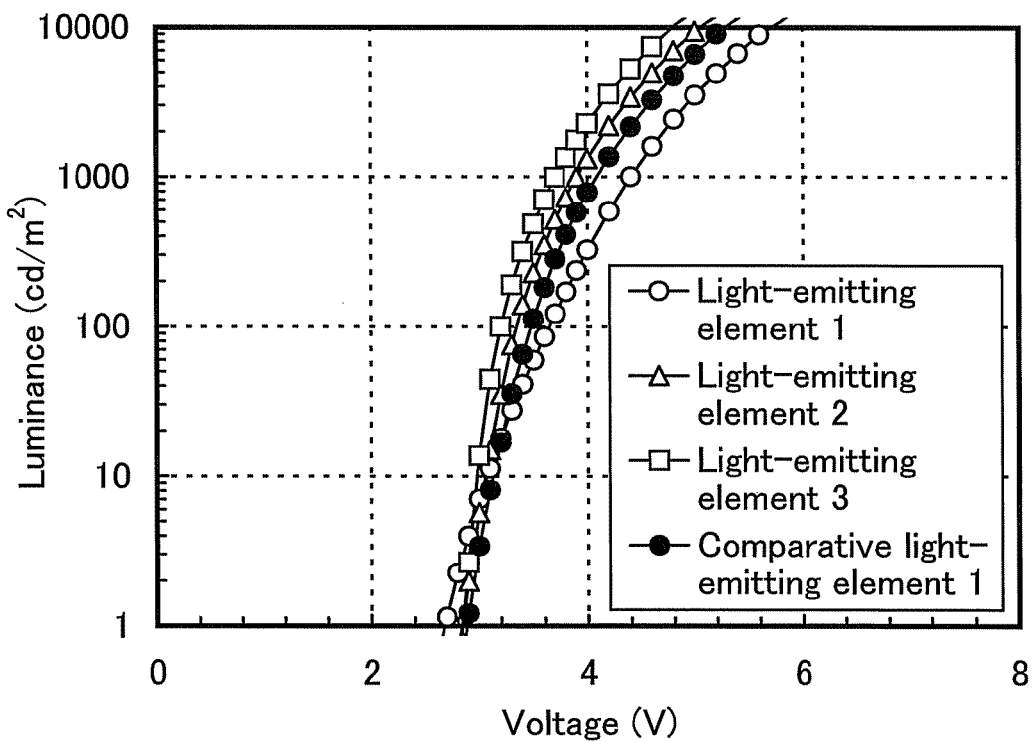
FIG. 15 shows voltage versus luminance characteristics of the light-emitting elements 1 to 3 and the comparative light-emitting element 1.
Figure 16:
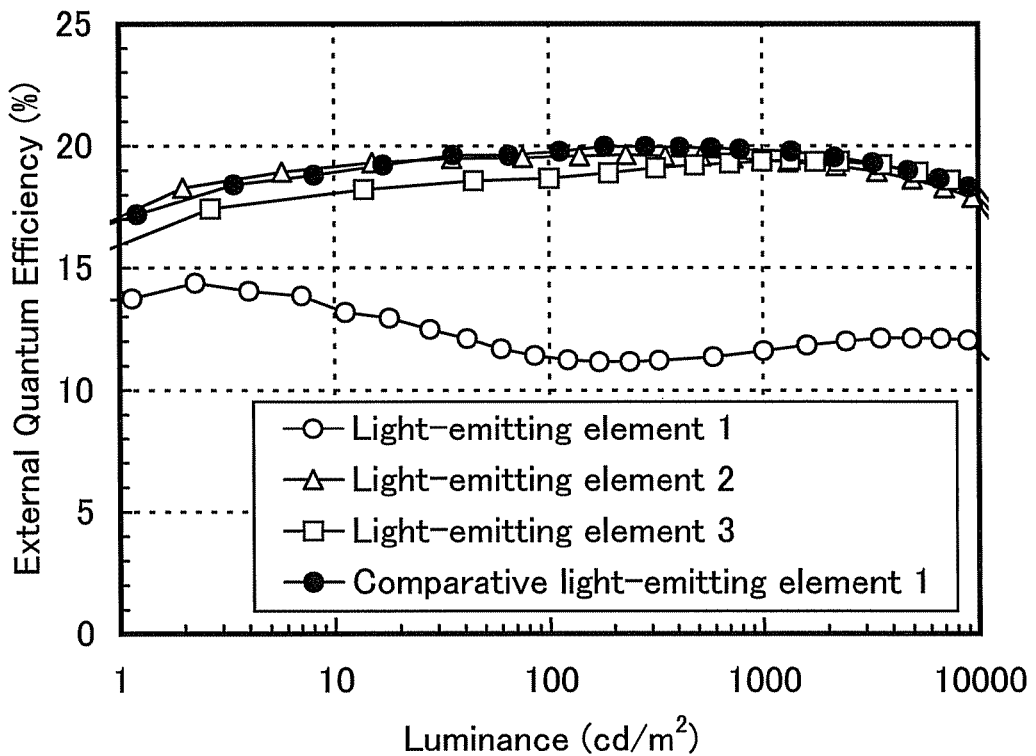
FIG. 16 shows luminance versus external quantum efficiency characteristics of the light-emitting elements 1 to 3 and the comparative light-emitting element 1.

FIG. 14 shows luminance versus current efficiency characteristics of the light-emitting elements 1 to 3 and the comparative light-emitting element 1. In FIG. 14, the horizontal axis represents luminance (cd/m$^2$) and the vertical axis represents current efficiency (cd/A). FIG. 15 shows voltage versus luminance characteristics of the light-emitting elements 1 to 3 and the comparative light-emitting element 1. In FIG. 15, the horizontal axis represents voltage (V) and the vertical axis represents luminance (cd/m$^2$). FIG. 16 shows luminance versus external quantum efficiency characteristics of the light-emitting elements 1 to 3 and the comparative light-emitting element 1. In FIG. 16, the horizontal axis represents luminance (cd/m$^2$) and the vertical axis represents external quantum efficiency (%).

From the above, it is found that each of the light-emitting elements 1 to 3 and the comparative light-emitting element 1 has favorable element characteristics.

Figure 17:
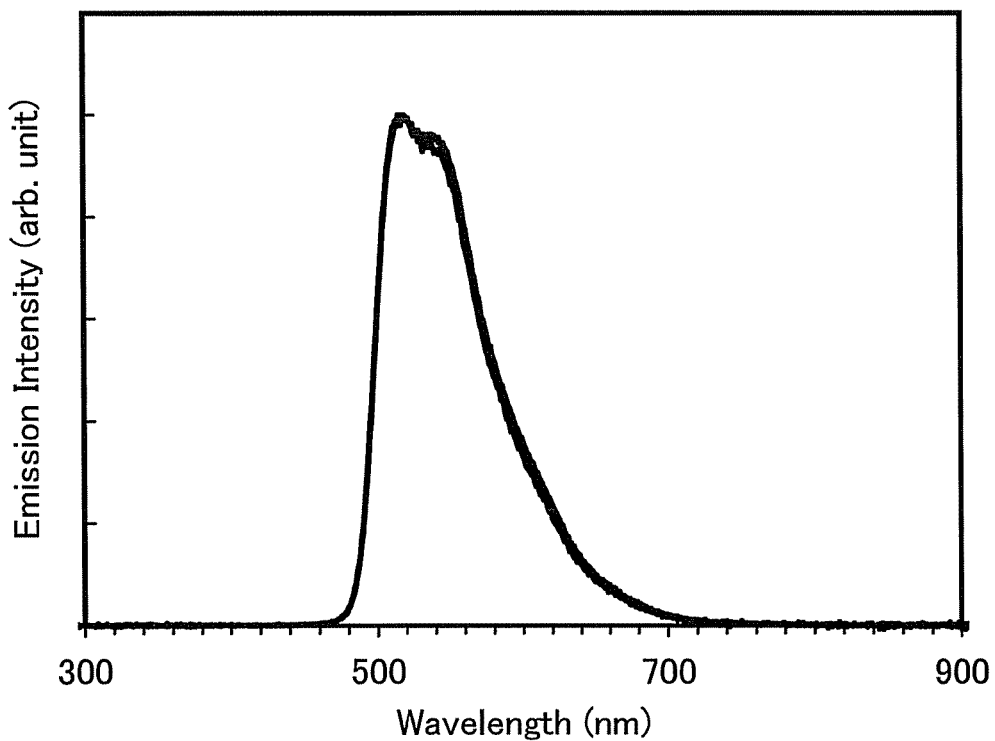
FIG. 17 shows emission spectra of the light-emitting elements 1 to 3 and the comparative light-emitting element 1.

Further, FIG. 17 shows emission spectra of the light-emitting elements 1 to 3 and of the comparative light-emitting element 1 obtained when a current of 0.1 mA was made to flow in the light-emitting elements 1 to 3 and the comparative light-emitting element 1. In FIG. 17, the horizontal axis indicates wavelength (nm) and the vertical axis indicates emission intensity (arbitrary unit). From FIG. 17, it is found that each of the light-emitting elements 1 to 3 and the comparative light-emitting element 1 emits green light originating from Ir(ppy)$_3$.

Figure 18:
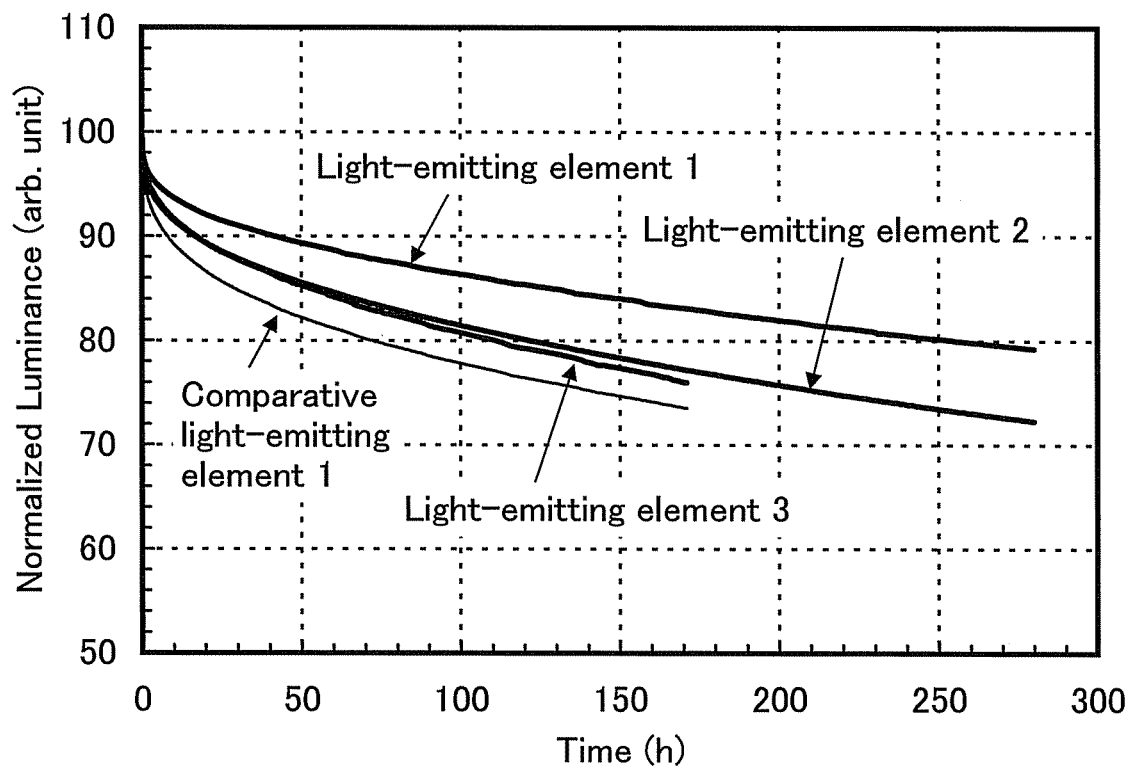
FIG. 18 shows time dependences of normalized luminances of the light-emitting elements 1 to 3 and the comparative light-emitting element 1.

Next, reliability tests were performed. In the reliability tests, a change in luminance over driving time was measured with an initial luminance taken as 100% under the conditions where the initial luminance was 5000 cd/m$^2$ and the current density was constant. The results are shown in FIG. 18. In FIG. 18, the vertical axis represents normalized luminance with an initial luminance of 100% and the horizontal axis represents time. From FIG. 18, it is found that, as for the light-emitting element having the two layers in the light-emitting layer, each of the light-emitting elements 1 to 3 has a smaller change in luminance over time than the comparative light-emitting element 1. In each of the light-emitting elements 1 to 3, the host material in the light-emitting layer on a cathode side has a lower LUMO level than that in the light-emitting layer on an anode side; in the comparative light-emitting element 1, the two layers in the light-emitting layer contain the same host material. It is also found that each of the light-emitting elements 1 to 3 has more favorable reliability than the comparative light-emitting element. In particular, it is found that the light-emitting element 1 has especially favorable reliability, where the LUMO level of the host material in the light-emitting layer on the cathode side is lower than that of the host material in the light-emitting layer on the anode side by approximately 0.58 eV.

Note that the LUMO levels of the materials were obtained by cyclic voltammetry (CV) measurements. In the cyclic voltammetry (CV) measurements, the potential of a working electrode with respect to a reference electrode is changed in an appropriate range, so that the reduction peak potential $E_{pc}$ and the oxidation peak potential $E_{pa}$ were obtained. The LUMO level was obtained by subtraction of a half-wave potential $E_{1/2}$ (an intermediate potential between $E_{pa}$ and $E_{pc}$), which was calculated from the reduction peak potential $E_{pc}$ and oxidation peak potential $E_{pa}$ obtained in measurements of reduction characteristics, from the potential energy of the reference electrode, which was used, with respect to the vacuum level.

For a solution for the CV measurements, dehydrated N,N-dimethylformamide (DMF, product of Sigma-Aldrich Co. LLC., 99.8%, catalog No. 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration thereof was 100 mmol/L. Further, the object to be measured was also dissolved in the solvent such that the concentration thereof was 2 mmol/L.

A platinum electrode (a PTE platinum electrode, produced by BAS Inc.) was used as the working electrode; a platinum electrode (a VC-3 Pt counter electrode (5 cm), produced by BAS Inc.) was used as an auxiliary electrode; and an Ag/Ag$^+$ electrode (an RE5 nonaqueous solvent reference electrode, produced by BAS Inc.) was used as the reference electrode. Note that the measurements were conducted at room temperature (20° C. to 25° C.). The scan speed at these CV measurements was set at 0.1 V/s.

Note that the potential energy of the reference electrode (Ag/Ag$^+$ electrode) with respect to the vacuum level corresponds to the Fermi level of the Ag/Ag$^+$ electrode, and should be calculated from a value obtained by measuring a substance whose potential energy with respect to the vacuum level is known, with the use of the reference electrode (Ag/Ag⁺ electrode).

A method for calculating the potential energy (eV) of the reference electrode (Ag/Ag⁺ electrode), which was used in this example, with respect to the vacuum level will be specifically described. It is known that the oxidation-reduction potential of ferrocene in methanol is +0.610V [vs. SHE] with respect to a standard hydrogen electrode (Reference: Christian R. Goldsmith et al., *J. Am. Chem. Soc.*, Vol. 124, No. 1, pp. 83-96, 2002). On the other hand, using the reference electrode used in this example, the oxidation-reduction potential of ferrocene in methanol was calculated to be +0.11 V [vs. Ag/Ag⁺]. Therefore, it is found that the potential energy of this reference electrode is lower than that of the standard hydrogen electrode by 0.50 [eV].

Note that it is known that the potential energy of the standard hydrogen electrode from the vacuum level is −4.44 eV (Reference: Toshihiro Ohnishi and Tamami Koyama, *High molecular EL material*, Kyoritsu Shuppan, pp. 64-67). Therefore, the potential energy of the reference electrode used in this example with respect to the vacuum level can be calculated at −4.44−0.50=−4.94 [eV].

Example 2

In Example 2, a light-emitting element according to one embodiment of the present invention (a light-emitting element 4) and comparative light-emitting elements 2 to 4 will be described with reference to FIGS. 1A and 1B. Chemical formulae of materials used in this example are shown below. Note that the light-emitting element 4 includes a light-emitting layer having a two-layer structure containing different host materials; a light-emitting layer on a cathode side of the two layers in the light-emitting layer contain a host material with a lower LUMO level than a host material in a light-emitting layer on an anode side. Note that in the comparative light-emitting element 1, a light-emitting layer on a cathode side and a light-emitting layer on an anode side contain the same host material. Further, in each of the comparative light-emitting elements 2 to 4, the LUMO level of a host material in a light-emitting layer on a cathode side is equal to or higher than that of a host material in a light-emitting layer on an anode side.

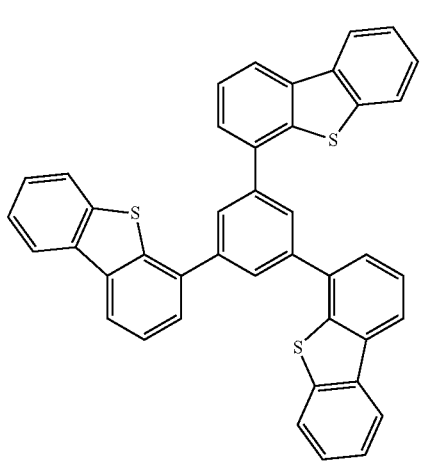

(i)

DBT3P-II

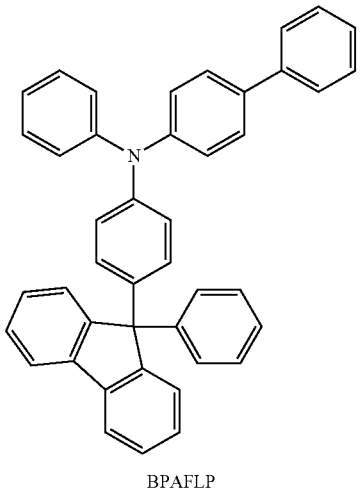

(ii)

BPAFLP

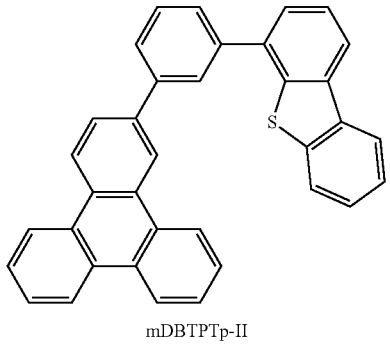

(iii)

mDBTPTp-II

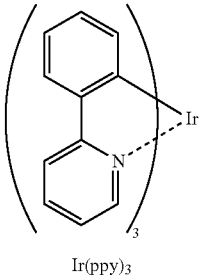

(iv)

Ir(ppy)₃

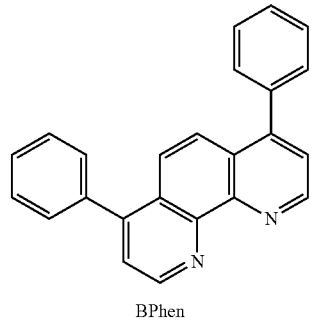

(v)

BPhen

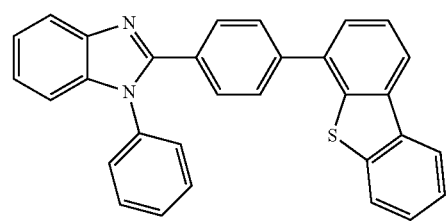

DBTBIm-II

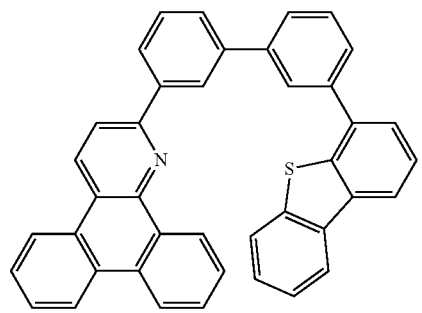

2mDBTBPDBQu-II

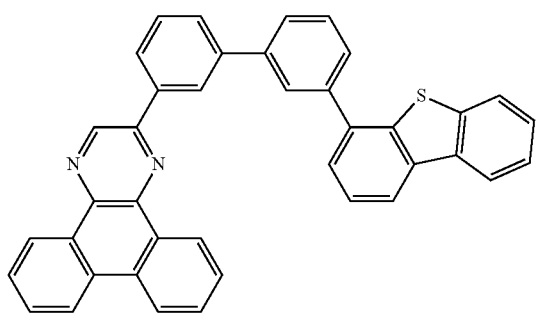

2mDBTBPDBq-II

A method for fabricating the light-emitting element 4 of this example and the comparative light-emitting elements 2 to 4 will be described below.

(Method for Fabricating Light-Emitting Element 4 and Comparative Light-Emitting Elements 2 to 4)

First, a film of indium tin oxide containing silicon oxide (ITSO) was formed over a glass substrate by a sputtering method, so that the first electrode 101 was formed. The thickness of the first electrode 101 was 110 nm and the electrode area was 2 mm×2 mm. Here, the first electrode 101 is an electrode that serves as an anode of the light-emitting element.

Next, as pretreatment for forming the light-emitting element over the substrate, a surface of the substrate was washed with water, baked at 200° C. for one hour, and subjected to UV ozone treatment for 370 seconds.

After that, the substrate was transferred into a vacuum evaporation apparatus whose pressure was reduced to about $10^{-4}$ Pa, vacuum baking at 170° C. for 30 minutes was performed in a heating chamber in the vacuum evaporation apparatus, and then the substrate was cooled down for about 30 minutes.

Then, the substrate over which the first electrode 101 was formed was fixed to a substrate holder provided in the vacuum evaporation apparatus such that the surface on which the first electrode 101 was formed faced downward. The pressure in the vacuum evaporation apparatus was reduced to about $10^{-4}$ Pa. After that, over the first electrode 101, 4,4',4''-(benzene-1,3,5-triyl)tri(dibenzothiophene) (abbreviation: DBT3P-II) represented by the above structural formula (i) and molybdenum(VI) oxide were co-evaporated by an evaporation method using resistance heating, so that the hole-injection layer 111 was formed. The thickness of the hole-injection layer 111 was 40 nm, and the weight ratio of DBT3P-II to molybdenum oxide was adjusted to 4:1 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) represented by the above structural formula (ii) was formed to a thickness of 20 nm over the hole-injection layer 111 to form the hole-transport layer 112.

Further, over the hole-transport layer 112, 2-[3'-(dibenzothiophen-4-yl)biphenyl-3-yl]dibenzo[f,h]quinoline (abbreviation: 2mDBTBPDBQu-II) represented by the above structural formula (vii) and tris(2-phenylpyridinato)iridium (abbreviation: Ir(ppy)$_3$) represented by the above structural formula (iv) were co-evaporated to a thickness of 20 nm with a weight ratio of 1:0.08 (=2mDBTBPDBQu-II:Ir(ppy)$_3$), so that the first light-emitting layer 113a was formed. Then, for the light-emitting element 4,2-[3'-(dibenzothiophen-4-yl)biphenyl-3-yl]dibenzo[f,h]quinoxaline (abbreviation: 2mDBTBPDBq-II) represented by the above structural formula (viii) and Ir(ppy)$_3$ were co-evaporated to a thickness of 20 nm with a weight ratio of 1:0.04 (=2mDBTBPDBq-II:Ir(ppy)$_3$), so that the second light-emitting layer 113b was formed. Thus, the light-emitting layer 113 was formed. Next, over the light-emitting layer 113, a film of 2mDBTBPDBq-II was formed to a thickness of 10 nm, and further, a film of bathophenanthroline (abbreviation: BPhen) represented by the above structural formula (v) was formed to a thickness of 20 nm, so that the electron-transport layer 114 was formed. Note that the LUMO level of 2mDBTBPDBq-II in a solution state is −2.94 eV, which is lower than the LUMO level of 2mDBTBPDBQu-II in a solution state, −2.59 eV, by approximately 0.35 eV.

For the comparative light-emitting element 2, over the hole-transport layer 112, 2mDBTBPDBQu-II and Ir(ppy)$_3$ were co-evaporated to a thickness of 20 nm with a weight ratio of 1:0.08 (=2mDBTBPDBQu-II:Ir(ppy)$_3$), so that the first light-emitting layer 113a was formed. Then, 2-[4-(dibenzothiophen-4-yl)phenyl]-1-phenyl-1H-benzimidazole (abbreviation: DBTBIm-II) represented by the above structural formula (vi) and Ir(ppy)$_3$ were co-evaporated to a thickness of 20 nm with a weight ratio of 1:0.04 (=DBTBIm-II:Ir(ppy)$_3$), so that the second light-emitting layer 113b was formed. Thus, the light-emitting layer 113 was formed. Next, over the light-emitting layer 113, a film of DBTBIm-II was formed to a thickness of 10 nm, and further, a film of BPhen was formed to a thickness of 20 nm, so that the electron-transport layer 114 was formed. Note that the LUMO level of DBTBIm-II in a solution state is −2.52 eV, which is higher than the LUMO level of 2mDBTBPDBQu-II in a solution state, −2.59 eV, by approximately 0.07 eV.

For the comparative light-emitting element 3, over the hole-transport layer 112, 2mDBTBPDBQu-II and Ir(ppy)$_3$ were co-evaporated to a thickness of 20 nm with a weight ratio of 1:0.08 (=2mDBTBPDBQu-II:Ir(ppy)$_3$), so that the first light-emitting layer 113a was formed. Then, 2mDBTB- PDBQu-II and Ir(ppy)$_3$ were co-evaporated to a thickness of 20 nm with a weight ratio of 1:0.04 (=2mDBTBPDBQu-II: Ir(ppy)$_3$), so that the second light-emitting layer 113b was formed. Thus, the light-emitting layer 113 was formed. Next, over the light-emitting layer 113, a film of 2mDBTBPDBQu-II was formed to a thickness of 10 nm, and further, a film of BPhen was formed to a thickness of 20 nm, so that the electron-transport layer 114 was formed.

For the comparative light-emitting element 4, over the hole-transport layer 112, 2mDBTBPDBQu-II and Ir(ppy)$_3$ were co-evaporated to a thickness of 20 nm with a weight ratio of 1:0.08 (=2mDBTBPDBQu-II:Ir(ppy)$_3$), so that the first light-emitting layer 113a was formed. Then, 4-[3-(triphenylen-2-yl)phenyl]dibenzothiophene (abbreviation: mDBTPTp-II) represented by the above structural formula (iii) and Ir(ppy)$_3$ were co-evaporated to a thickness of 20 nm with a weight ratio of 1:0.04 (=mDBTPTp-II:Ir(ppy)$_3$), so that the second light-emitting layer 113b was formed. Thus, the light-emitting layer 113 was formed. Next, over the light-emitting layer 113, a film of mDBTPTp-II was formed to a thickness of 10 nm, and further, a film of bathophenanthroline (abbreviation: BPhen) represented by the above structural formula (v) was formed to a thickness of 20 nm, so that the electron-transport layer 114 was formed. Note that the LUMO level of mDBTPTp-II in a solution state is −2.36 eV, which is higher than the LUMO level of 2mDBTBPDBQu-II in a solution state, −2.59 eV, by approximately 0.23 eV.

After the electron-transport layer 114 was formed, lithium fluoride (LiF) was evaporated to a thickness of 1 nm to form the electron-injection layer 115.

Lastly, aluminum was evaporated to a thickness of 200 nm as the second electrode 102 serving as a cathode. Thus, the light-emitting element 4 of this example and the comparative light-emitting elements 2 to 4 were fabricated.

Note that in the above evaporation process, evaporation was all performed by a resistance heating method.

Further, the molecular weight of mDBTPTp-II is 486, that of 2mDBTBPDBq-II is 564, that of DBTBIm-II is 452, and that of 2mDBTBPDBQu-II is 563.

Table 2 shows element structures of the thus obtained light-emitting element 4 and the comparative light-emitting elements 2 to 4.

In a glove box containing a nitrogen atmosphere, the light-emitting element 4 and the comparative light-emitting elements 2 to 4 were each sealed with a glass substrate so as not to be exposed to the air (specifically, a sealing material was applied onto an outer edge of the element and heat treatment was performed at 80° C. for an hour at the time of sealing). Then, reliability of the light-emitting elements was measured. Note that the measurement was carried out at room temperature (in an atmosphere kept at 25° C.).

Figure 19:
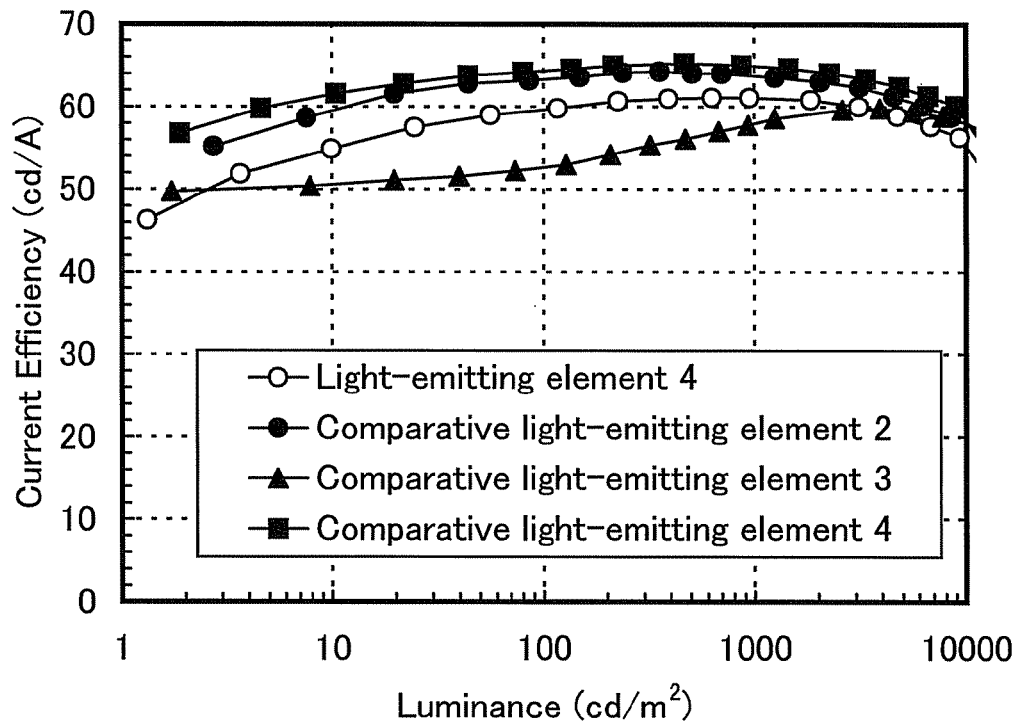
FIG. 19 shows luminance versus current efficiency characteristics of a light-emitting element 4 and comparative light-emitting elements 2 to 4.
Figure 20:
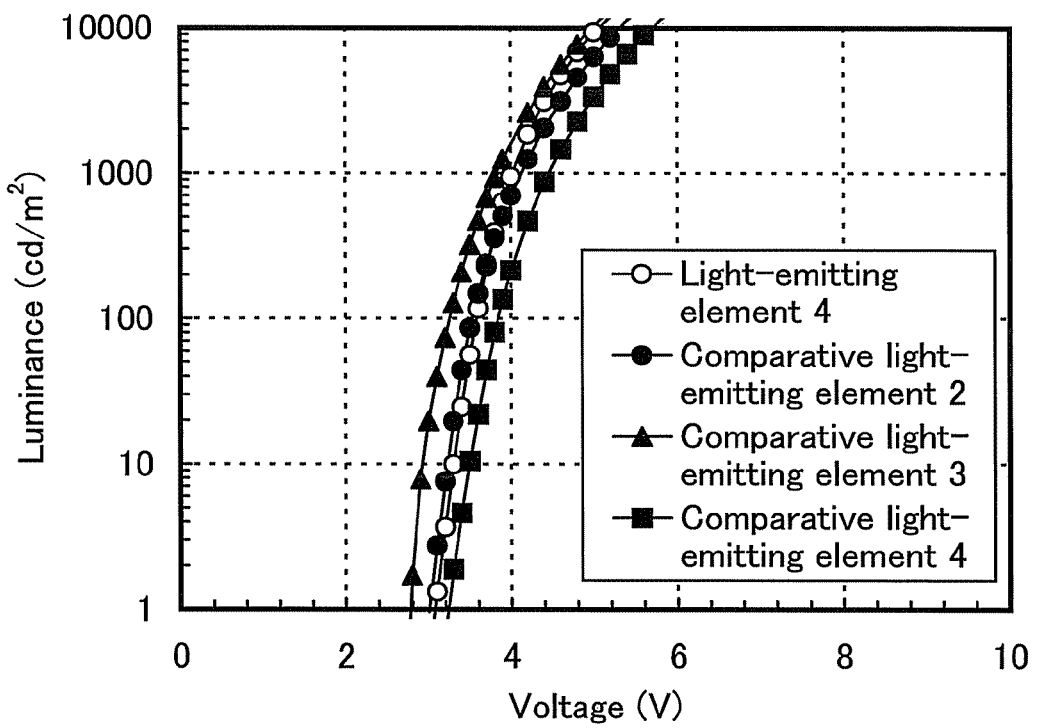
FIG. 20 shows voltage versus luminance characteristics of the light-emitting element 4 and the comparative light-emitting elements 2 to 4.
Figure 21:
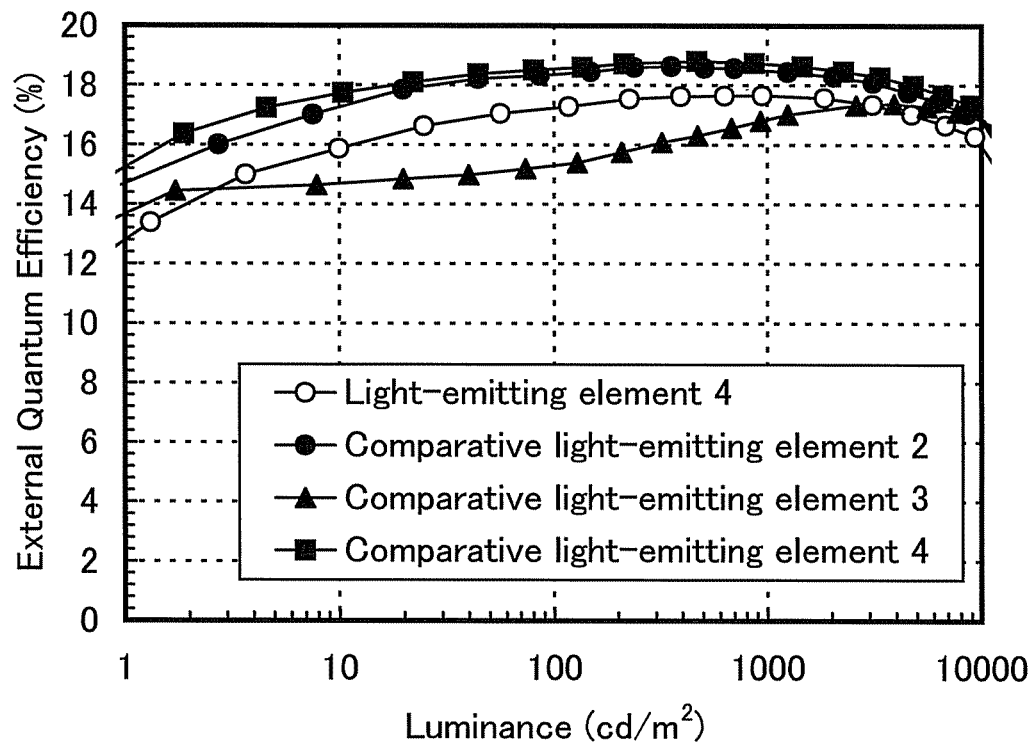
FIG. 21 shows luminance versus external quantum efficiency characteristics of the light-emitting element 4 and the comparative light-emitting elements 2 to 4.

FIG. 19 shows luminance versus current efficiency characteristics of the light-emitting element 4 and the comparative light-emitting elements 2 to 4. In FIG. 19, the horizontal axis represents luminance (cd/m$^2$) and the vertical axis represents current efficiency (cd/A). FIG. 20 shows voltage versus luminance characteristics of the light-emitting element 4 and the comparative light-emitting elements 2 to 4. In FIG. 20, the horizontal axis represents voltage (V) and the vertical axis represents luminance (cd/m$^2$). FIG. 21 shows luminance versus external quantum efficiency characteristics of the light-emitting element 4 and the comparative light-emitting elements 2 to 4. In FIG. 21, the horizontal axis represents luminance (cd/m$^2$) and the vertical axis represents external quantum efficiency (%).

From the above, it is found that each of the light-emitting element 4 and the comparative light-emitting elements 2 to 4 has favorable element characteristics.

Figure 22:
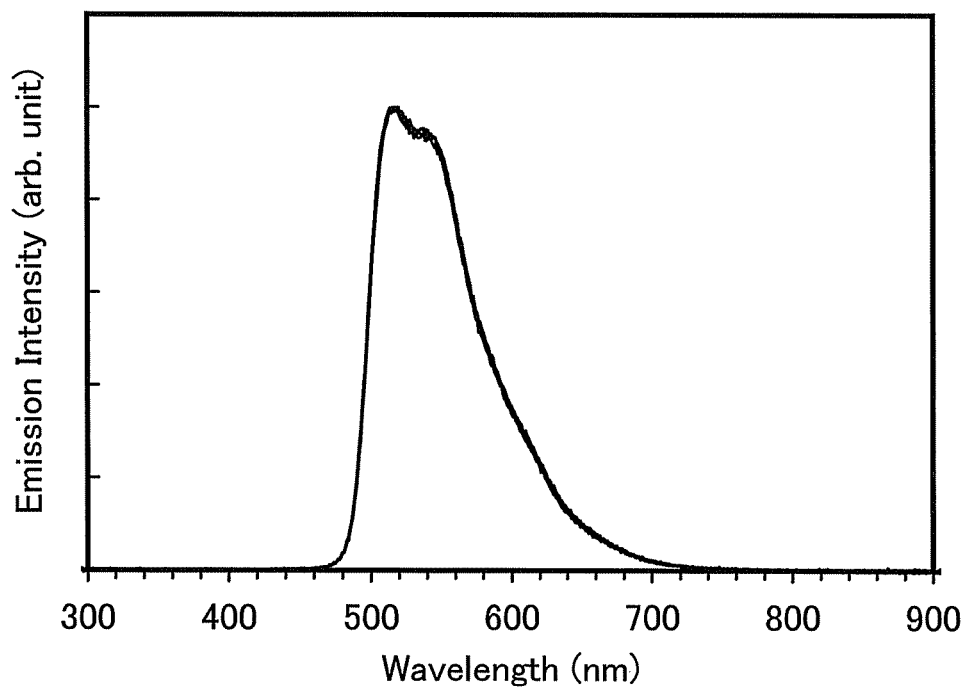
FIG. 22 shows emission spectra of the light-emitting element 4 and the comparative light-emitting elements 2 to 4.

Further, FIG. 22 shows emission spectra of the light-emitting element 4 and of the comparative light-emitting elements 2 to 4 obtained when a current of 0.1 mA was made to flow in the light-emitting element 4 and the comparative light-emitting elements 2 to 4. In FIG. 22, the horizontal axis indicates wavelength (nm) and the vertical axis indicates emission intensity (arbitrary unit). From FIG. 22, it is found that each of the light-emitting element 4 and the comparative light-emitting elements 2 to 4 emits green light originating from Ir(ppy)$_3$.

Figure 23:
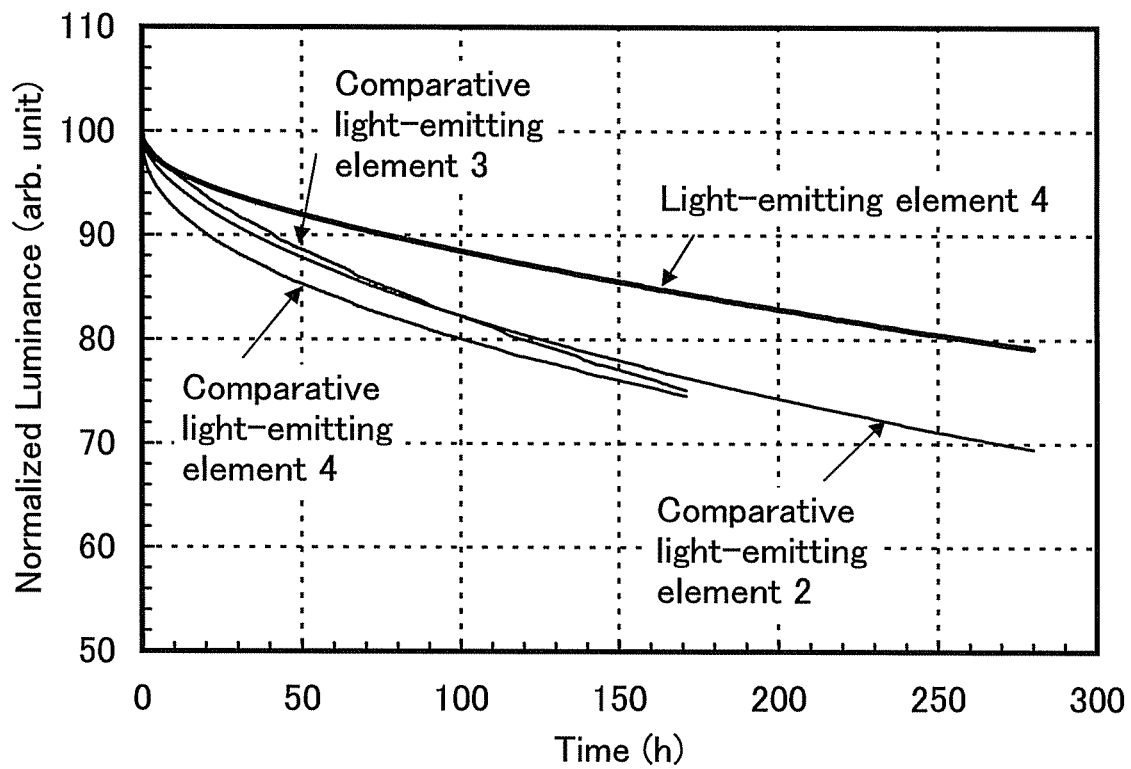
FIG. 23 shows time dependences of normalized luminances of the light-emitting element 4 and the comparative light-emitting elements 2 to 4.

Next, reliability tests were performed. In the reliability tests, a change in luminance over driving time was measured with an initial luminance taken as 100% under the conditions where the initial luminance was 5000 cd/m$^2$ and the current density was constant. The results are shown in FIG. 23. In FIG. 23, the vertical axis represents normalized luminance with an initial luminance of 100% and the horizontal axis represents time. From FIG. 23, it is found that, as for the light-emitting element having the two layers in the light-emitting layer, the light-emitting element 4 has a smaller

TABLE 2

| | | | Light-emitting Layer | | Electron-transport Layer | | |
|---|---|---|---|---|---|---|---|
| | Hole-injection Layer | Hole-transport Layer | 1st Light-emitting Layer | 2nd Light-emitting Layer | 1st Electron-transport Layer | 2nd Electron-transport Layer | Electron-injection Layer |
| Light-emitting Element 4 | DBT3P-II:MoOx 4:1 40 nm | BPAFLP 20 nm | 2mDBTBPDBQu-II:Ir(ppy)3 1:0.08 20 nm | 2mDBTBPDBq-II:Ir(ppy)3 1:0.04 20 nm | 2mDBTBPDBq-II 10 nm | Bphen 20 nm | LiF 1 nm |
| Comparative Light-emitting Element 2 | | | | DBTBIm-II:Ir(ppy)3 1:0.04 20 nm | DBTBIm-II 10 nm | | |
| Comparative Light-emitting Element 3 | | | | 2mDBTBPDBQu-II:Ir(ppy)3 1:0.04 20 nm | 2mDBTBPDBQu-II 10 nm | | |
| Comparative Light-emitting Element 4 | | | | mDBTPTp-II:Ir(ppy)3 1:0.04 20 nm | mDBTPTp-II 10 nm | | | change in luminance over time than any of the comparative light-emitting elements 2 to 4 1. In the light-emitting element 4, the host material in the light-emitting layer on a cathode side has a lower LUMO level than that in the light-emitting layer on an anode side; in each of the comparative light-emitting elements 2 to 4, the two layers in the light-emitting layer contain the same host material or the LUMO level of the host material on a cathode side is higher than that of the host material on an anode side. It is also found that the light-emitting element 4 has more favorable reliability than any of the comparative light-emitting elements 2 to 4.

Note that the method for calculating the LUMO level of each material is the same as that in Example 1, and therefore the description thereof is omitted.

This application is based on Japanese Patent Application serial No. 2012-081141 filed with Japan Patent Office on Mar. 30, 2012, the entire contents of which are hereby incorporated by reference.

What is claimed is:

1. A light-emitting element comprising:
an anode;
a cathode; and
an EL layer between the anode and the cathode, the EL layer including a light-emitting layer,
wherein the light-emitting layer includes a first light-emitting layer and a second light-emitting layer,
wherein the first light-emitting layer is between the second light-emitting layer and the anode,
wherein the second light-emitting layer is between the first light-emitting layer and the cathode,
wherein the first light-emitting layer includes a first host material having a higher electron transporting property than a hole transporting property and a first emission center substance,
wherein the second light-emitting layer includes a second host material having an electron transporting property and a second emission center substance,
wherein the first host material and the second host material each have an electron mobility of higher than or equal to $10^{-6}$ cm$^2$/Vs, and
wherein a difference between a LUMO level of the first host material and a LUMO level of the second host material is greater than or equal to 0.1 eV and less than or equal to 0.6 eV.

2. The light-emitting element according to claim 1, wherein the first emission center substance is a same substance as the second emission center substance.

3. The light-emitting element according to claim 1, wherein the first emission center substance and the second emission center substance are each able to convert a triplet excited state into light emission.

4. The light-emitting element according to claim 1, wherein the first emission center substance and the second emission center substance are each an iridium complex.

5. The light-emitting element according to claim 1, wherein neither of the first host material nor the second host material has an aromatic amine skeleton in a skeleton.

6. A light-emitting element comprising:
an anode;
a cathode; and
an EL layer between the anode and the cathode, the EL layer including a light-emitting layer,
wherein the light-emitting layer includes a first light-emitting layer and a second light-emitting layer,
wherein the first light-emitting layer is between the second light-emitting layer and the anode,
wherein the second light-emitting layer is between the first light-emitting layer and the cathode,
wherein the first light-emitting layer includes a first host material having a higher electron transporting property than a hole transporting property and a first emission center substance,
wherein the second light-emitting layer includes a second host material having an electron transporting property and a second emission center substance,
wherein the first host material and the second host material each have an electron mobility of higher than or equal to $10^{-6}$ cm$^2$/Vs,
wherein the first host material and the second host material each include a molecular weight of greater than or equal to 300 and less than or equal to 2000, and include a six-membered aromatic ring in an electron-transport skeleton,
wherein nitrogen atoms included in the six-membered aromatic ring in the first host material are fewer than nitrogen atoms included in the six-membered aromatic ring in the second host material, and
wherein a difference between a LUMO level of the first host material and a LUMO level of the second host material is greater than or equal to 0.1 eV and less than or equal to 0.6 eV.

7. The light-emitting element according to claim 6, wherein the six-membered aromatic ring of the first host material includes a benzene skeleton or a pyridine skeleton, and wherein the six-membered aromatic ring of the second host material includes a diazine skeleton.

8. The light-emitting element according to claim 6, wherein the first emission center substance is a same substance as the second emission center substance.

9. The light-emitting element according to claim 6, wherein the first emission center substance and the second emission center substance are each able to convert a triplet excited state into light emission.

10. The light-emitting element according to claim 6, wherein the first emission center substance and the second emission center substance are each an iridium complex.

11. The light-emitting element according to claim 6, wherein neither of the first host material nor the second host material has an aromatic amine skeleton in a skeleton.

* * * * *